(12) United States Patent
Hara et al.

(10) Patent No.: US 7,064,384 B2
(45) Date of Patent: Jun. 20, 2006

(54) SEMICONDUCTOR DEVICE

(75) Inventors: Takuma Hara, Kanagawa (JP); Mitsuhiko Kitagawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/650,670

(22) Filed: Aug. 29, 2003

(65) Prior Publication Data

US 2004/0094798 A1 May 20, 2004

(30) Foreign Application Priority Data

Sep. 2, 2002 (JP) ............................. 2002-256774

(51) Int. Cl.
*H01L 29/94* (2006.01)
*H01L 29/417* (2006.01)

(52) U.S. Cl. ..................... 257/330; 257/120
(58) Field of Classification Search ............... 257/330, 257/333, 340, 341, 120, 369, 409
See application file for complete search history.

(56) References Cited

U.S. PATENT DOCUMENTS

| | | | | |
|---|---|---|---|---|
| 5,378,914 A | * | 1/1995 | Ohzu et al. .................. | 257/369 |
| 5,793,065 A | * | 8/1998 | Shinohe et al. .............. | 257/147 |
| 6,580,123 B1 | * | 6/2003 | Thapar ........................ | 257/330 |
| 6,621,132 B1 | * | 9/2003 | Onishi et al. ................ | 257/409 |
| 6,720,615 B1 | * | 4/2004 | Fujihira ...................... | 257/328 |
| 6,777,746 B1 | * | 8/2004 | Kitagawa et al. ........... | 257/335 |
| 2004/0094798 A1 | * | 5/2004 | Hara et al. .................. | 257/330 |

FOREIGN PATENT DOCUMENTS

| | | |
|---|---|---|
| JP | 2002-26324 | 1/2002 |
| JP | 2002-94061 | 3/2002 |

\* cited by examiner

*Primary Examiner*—Michael Trinh
*Assistant Examiner*—Kiesha Rose
(74) *Attorney, Agent, or Firm*—Oblon, Spivak, McClelland, Maier & Neustadt, P.C.

(57) ABSTRACT

A semiconductor device comprises: a first main electrode; a second main electrode; a semiconductor base region of a first conductivity type; a gate electrode provided in a trench through an insulating film, the trench being formed to penetrate the semiconductor base region; and a first semiconductor region of a first conductivity type and a second semiconductor region of a second conductivity type provided under the semiconductor base region. A flow of a current between the first and second main electrodes when a voltage of a predetermined direction is applied between these electrodes is controllable in accordance with a voltage applied to the gate electrode. A depleted region extends from a junction between the first and the second semiconductor regions reaching the trench.

16 Claims, 21 Drawing Sheets

SEMICONDUCTOR DEVICE

CROSS-REFERENCE TO RELATED APPLICATIONS

This application is based upon and claims the benefit of priority from the prior Japanese Patent Application No. 2002-256774, filed on Sep. 2, 2002; the entire contents of which are incorporated herein by reference.

BACKGROUND OF THE INVENTION

The present invention relates to a semiconductor device, and more particularly, it relates to a semiconductor device which has a trench gate type structure.

Semiconductor devices, such as power metal-oxide semiconductor field effect transistor (Metal-Oxide-Semiconductor Field Effect Transistor) and IGBT (Insulated Gate Bipolar Transistor), have been used for various kinds of fields including the field for electric power control. In these semiconductor devices, it is desired to increase the efficiency in order to meet the demand of saving of energy in recent years.

In order to satisfy the demand, it is effective to reduce the electrical conduction loss, i.e., "ON resistance" of the element. So far, reducing ON resistance has been sought by carrying out the miniaturization of the cell. Moreover, by adopting a "trench gate structure" as the element structure, the channel width has been made greater and the channel density has been increased sharply.

Currently, the further miniaturization of the trench gate structure is being carried out, and ON resistance of the element has come to be improved sharply. As an example which indicated the trench gate type semiconductor device where the channel density has been increased, Japanese Patent Laid-Open Publication No.2001-102579 can be mentioned which discloses a device where increase of the channel density and promotion of the degree modulation of conduction are compatible by adopting a ladder-like trench gate structure.

FIG. 23 is a schematic diagram showing the semiconductor device which was examined by the inventors of the present invention in the course of attaining this invention.

That is, this figure shows the cross-sectional structure near the gate of a trench gate type n channel type MOSFET. An $n^-$ type epitaxial region 6 and a p type base region 5 are formed on an $n^+$ type substrate 7. Trenches are formed from the surface to the epitaxial layer 6, and are embedded with a gate oxide 3 and a gate electrode 1 to form an embedded gate structure. An insulating interlayer film 4 is provided appropriately on the embedded gate, and n type source regions 2 are formed around the trenches. Further, a drain region 8 is appropriately provided in the back side of the substrate 7.

By applying a predetermined bias voltage to the gate electrode 1, this MOSFET can form a channel region in the circumferences of the embedded trenches, and can carry out switching operation which changes the conduction state between the source region 2 and the drain regions 8 into "ON" state.

Now, in such a semiconductor device, in order to improve the efficiency of operation, it is important to reduce a "parasitic capacitance" as well as reducing the "ON resistance", and to increase the operating speed.

For example, when performing inverter control, for example, combining two or more switching elements, if the operating speed of the elements is slow, it is necessary to set up a "dead time" which serves as "OFF" in all the switching elements that constitute an arm for a long time in order to prevent the penetration current of a rectification arm. As a result, a loss increases. On the other hand, if the operating speed becomes larger by reducing the parasitic capacitance of the switching elements, the "dead time" can be shortened and the loss can be reduced.

The parasitic capacitance of the semiconductor device illustrated in FIG. 23 can be divided into some constituents. First, the capacitance (Cgd) between the drain and the gate can be mentioned. This capacitance is produced in the region where the epitaxial region 6 and gate oxide 3 are in contact with. Next, the capacitance (Cds) between the drain and the source can be mentioned. This capacitance is produced in the p-n junction where the epitaxial region 6 and the base region 5 touch.

Moreover, the capacitance (Cgs) between the gate and the source can be mentioned. This capacitance is produced in the regions where the gate oxide 3 and the source region 2 touch, and where the gate oxide 3 and the base region 5 touch.

Since these capacitance constituents do loss to switching operation of the semiconductor device, they need to be reduced. In order to reduce the capacitance, it may be considered to make area of these contact parts smaller, or to promote depletion by lowering the carrier concentration of each semiconductor region, etc.

However, if these methods are employed, there will be a problem that it becomes difficult to juggle the "ON resistance" and the "parasitic capacitance", or to juggle the "breakdown voltage" and the "parasitic capacitance" of the semiconductor device. Thus, an improvement of a total performance becomes difficult.

SUMMARY OF THE INVENTION

According to an embodiment of the invention, there is provided a semiconductor device comprising: a first main electrode; a second main electrode; a semiconductor base region of a first conductivity type; a gate electrode provided in a trench through an insulating film, the trench being formed to penetrate the semiconductor base region; and a first semiconductor region of a first conductivity type and a second semiconductor region of a second conductivity type provided under the semiconductor base region, a flow of a current between the first and second main electrodes when a voltage of a predetermined direction is applied between these electrodes being controllable in accordance with a voltage applied to the gate electrode, and a depleted region extending from a junction between the first and the second semiconductor regions reaching the trench.

According to other embodiment of the invention, there is provided a semiconductor device comprising: a first semiconductor region of a second conductivity type; a second semiconductor region of a first conductivity type provided on the first semiconductor region, a third semiconductor region of a second conductivity type provided on the second semiconductor region, a fourth semiconductor region of a first conductivity type provided on the third semiconductor region, a fifth semiconductor region of a second conductivity type provided on the fourth semiconductor region, a trench penetrating at least the third through fifth semiconductor regions, a bottom of the trench being provided within the second semiconductor region; and a gate electrode provided in the trench through an insulating film.

According to other embodiment of the invention, there is provided a semiconductor device comprising: a first semiconductor region of a second conductivity type; a second semiconductor region of a first conductivity type provided on the first semiconductor region, a third semiconductor region of a second conductivity type provided on the second semiconductor region, a fourth semiconductor region of a first conductivity type provided on the third semiconductor region, a fifth semiconductor region of a second conductivity type provided on the fourth semiconductor region, a trench penetrating at least the third through fifth semiconductor regions, a bottom of the trench being provided between an upper surface and a lower surface of the second semiconductor region; a sixth semiconductor region of a second conductivity type provided in contact with the bottom of the trench; and a gate electrode provided in the trench through an insulating film.

According to other embodiment of the invention, there is provided a semiconductor device comprising: a first semiconductor region of a second conductivity type; a semiconductor layer provided on the first semiconductor region and having a plurality of second semiconductor regions of a first conductivity type and a plurality of third semiconductor regions of a second conductivity type, the second and the third semiconductor regions being arranged alternately; a fourth semiconductor region of a first conductivity type provided on the semiconductor layer, a fifth semiconductor region of a second conductivity type provided on the fourth semiconductor region, a trench penetrating at least the fourth and the fifth semiconductor regions, a bottom of the trench being provided within the semiconductor layer; and a gate electrode provided in the trench through an insulating film.

BRIEF DESCRIPTION OF THE DRAWINGS

The present invention will be understood more fully from the detailed description given here below and from the accompanying drawings of the embodiments of the invention. However, the drawings are not intended to imply limitation of the invention to a specific embodiment, but are for explanation and understanding only.

In the drawings.

DETAILED DESCRIPTION

Referring to drawings, some embodiments of the present invention will now be described in detail.

(First Embodiment)

Figure 1:
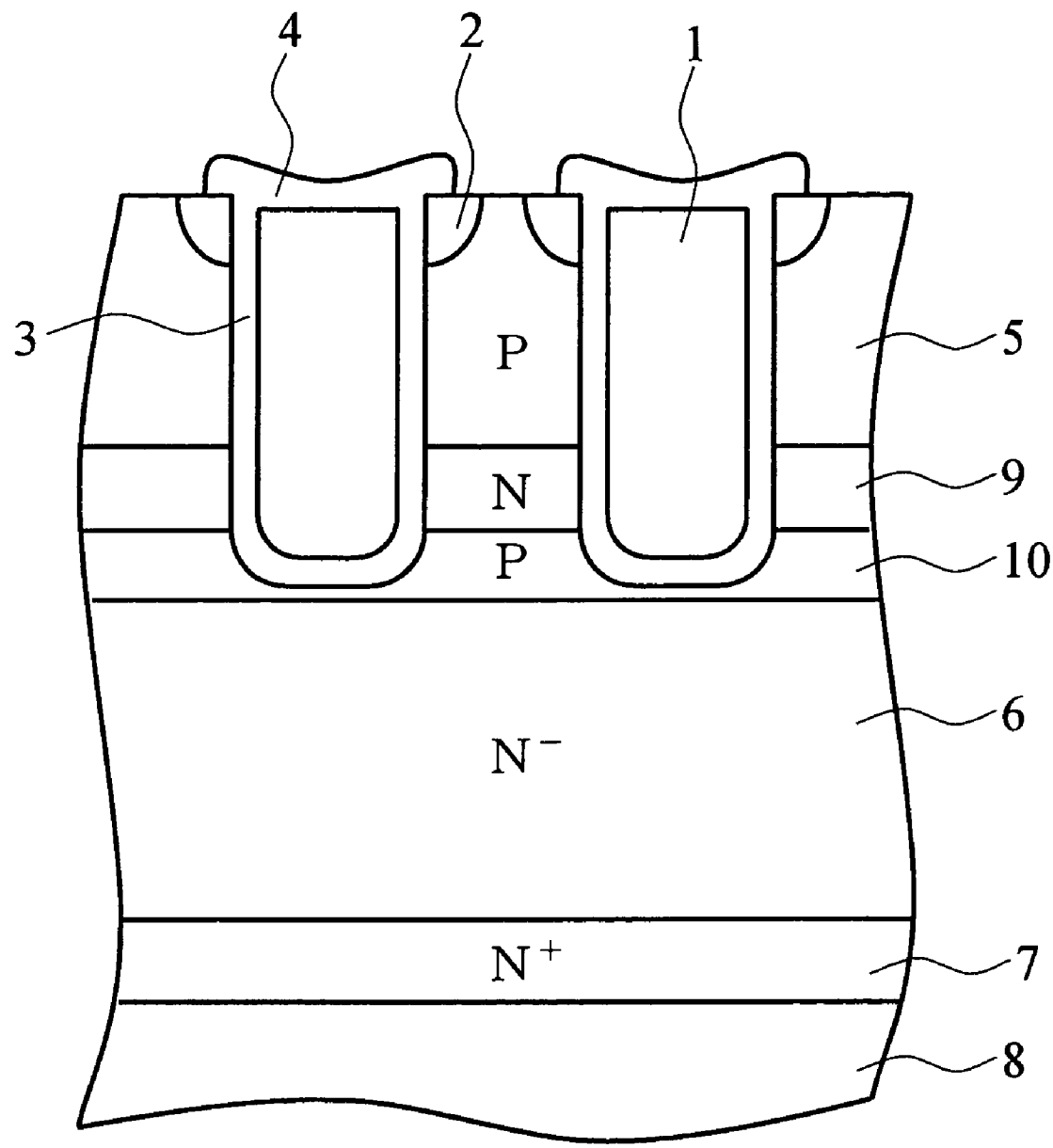
FIG. 1 is a schematic diagram illustrating the principal part sectional structure of the semiconductor device according to the first embodiment of the invention.

FIG. 1 is a schematic diagram illustrating the principal part sectional structure of the semiconductor device according to the first embodiment of the invention.

That is, this figure expresses a trench gate type semiconductor device. In the case of this semiconductor device, a thin p type region 10 and a thin n type region 9 are inserted in this order between the n⁻ type epitaxial region 6 and the p type base region 5 provided on the n⁺ type substrate 7. These p type region 10 and n type region 9 are substantially depleted by the p-n junction formed between them.

Figure 2:
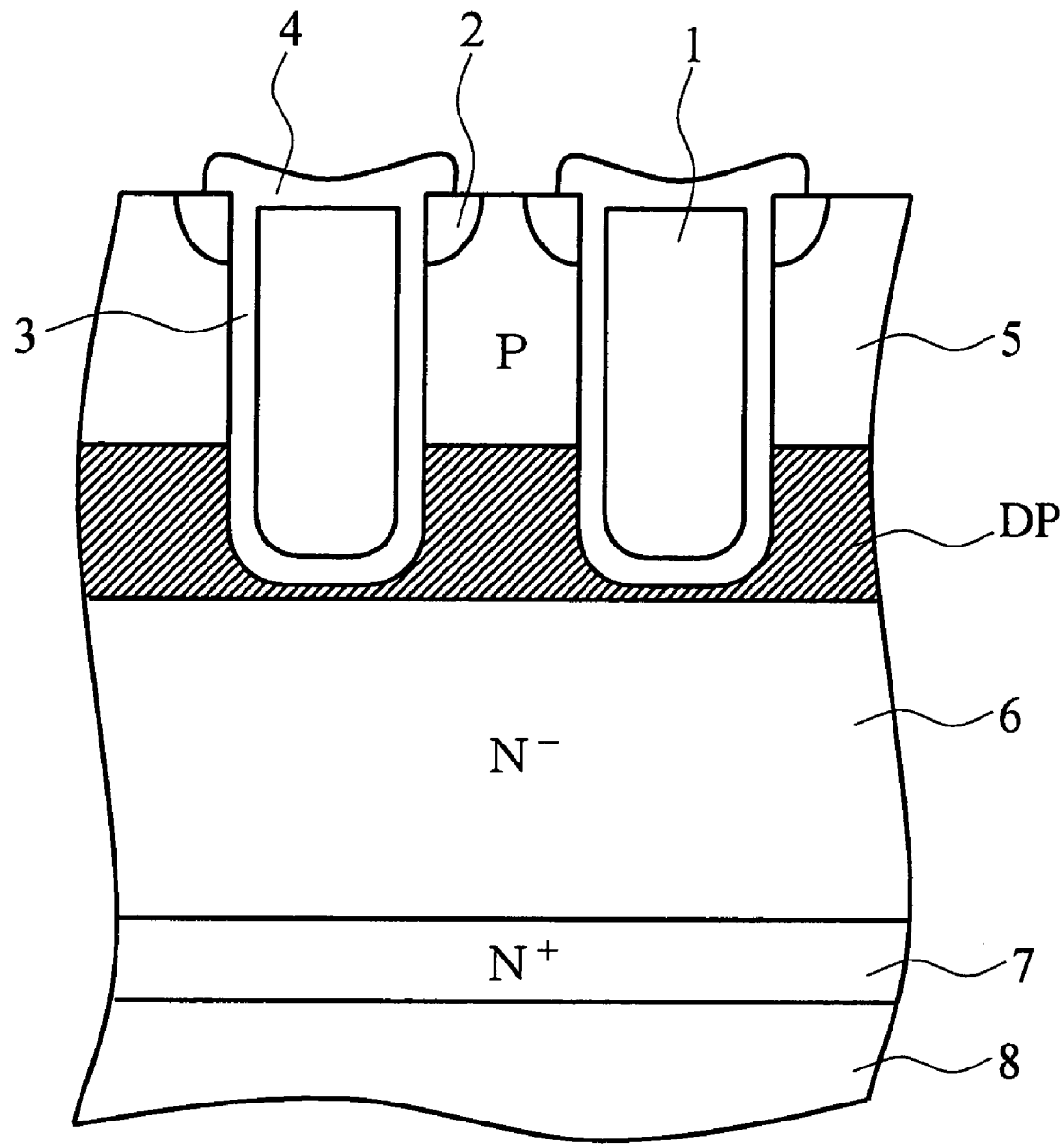
FIG. 2 is a schematic diagram showing the state where the depleted region DP spread from the p-n junction to the p type region 10 and the n type region 9.

FIG. 2 is a schematic diagram showing the state where the depleted region DP spread from the p-n junction to the p type region 10 and the n type region 9. In this embodiment, the capacitance Cds between the drain and the source and the capacitance Cgd between the drain and the gate can be especially lowered effectively by forming such a depleted region DP in the circumference of the trenches. As the result, the parasitic capacitance of the semiconductor device can be reduced, and the multiplication value of "ON resistance" and a "parasitic capacitance" can be lowered.

Hereafter, the effect acquired in this embodiment will be explained quantitatively.

First, the characteristic of the semiconductor device obtained when the concentrations of the n type region 9 and the p type region 10 are changed is explained.

Table 1 shows the relationship between the carrier concentrations Nd of the n type region 9 and the p type region 10, and the characteristics of the semiconductor device.

rather than in the "structure B". This tendency becomes more remarkable when the carrier concentration exceeds $1 \times 10^{16}/cm^3$.

On the other hand, the parasitic capacitance of "structure A" becomes generally lower rather than that of "structure B." Especially, $C_{out}$ which affects the switching characteristic of the semiconductor device becomes much lower in "structure A." As a result, the CR multiplication value ($C_{out} \times R_{on}$) of the ON resistance Ron and the capacitance $C_{out}$ becomes lower in "structure A" than in "structure B."

TABLE 1

|  | Nd | Vb | vth | Ron | Cout | Cgd | Cds | Cgg | Cout × Ron | FET area |
|---|---|---|---|---|---|---|---|---|---|---|
| Structure A | 1E+12 | 45.2 | 1.24 | 13.3 | 313.8 | 239 | 74.8 | 1863 | 4.2 | 1 mm² |
|  | 1E+14 | 45.1 | 1.24 | 13.3 | 313 | 238 | 75 | 1724 | 4.2 | 1 mm² |
|  | 5E+14 | 45.0 | 1.24 | 13.3 | 309 | 236 | 73 | 1788 | 4.1 | 1 mm² |
|  | 8E+14 | 44.9 | 1.23 | 13.3 | 307 | 234 | 73 | 1786 | 4.1 | 1 mm² |
|  | 2E+15 | 45 | 1.23 | 13.4 | 300 | 229 | 71 | 1781 | 4.0 | 1 mm² |
|  | 1E+16 | 45 | 1.23 | 16.1 | 228 | 173 | 55 | 1724 | 3.7 | 1 mm² |
|  | 2E+16 | 44.9 | 1.22 | 29 | 197 | 150 | 47 | 1697 | 5.7 | 1 mm² |
|  | 3E+16 | 45 | 1.22 | 128 | 177 | 137 | 40 | 1678 | 22.7 | 1 mm² |
|  | 1E+17 |  |  |  | 201 | 155 | 46 |  |  |  |
|  | 1E+18 |  |  |  | 236 | 167 | 69 |  |  |  |
| Structure B | — | 45.2 | 1.24 | 10 | 493 | 366 | 127 | 1863 | 4.9 | 1 mm² |

Figure 3:
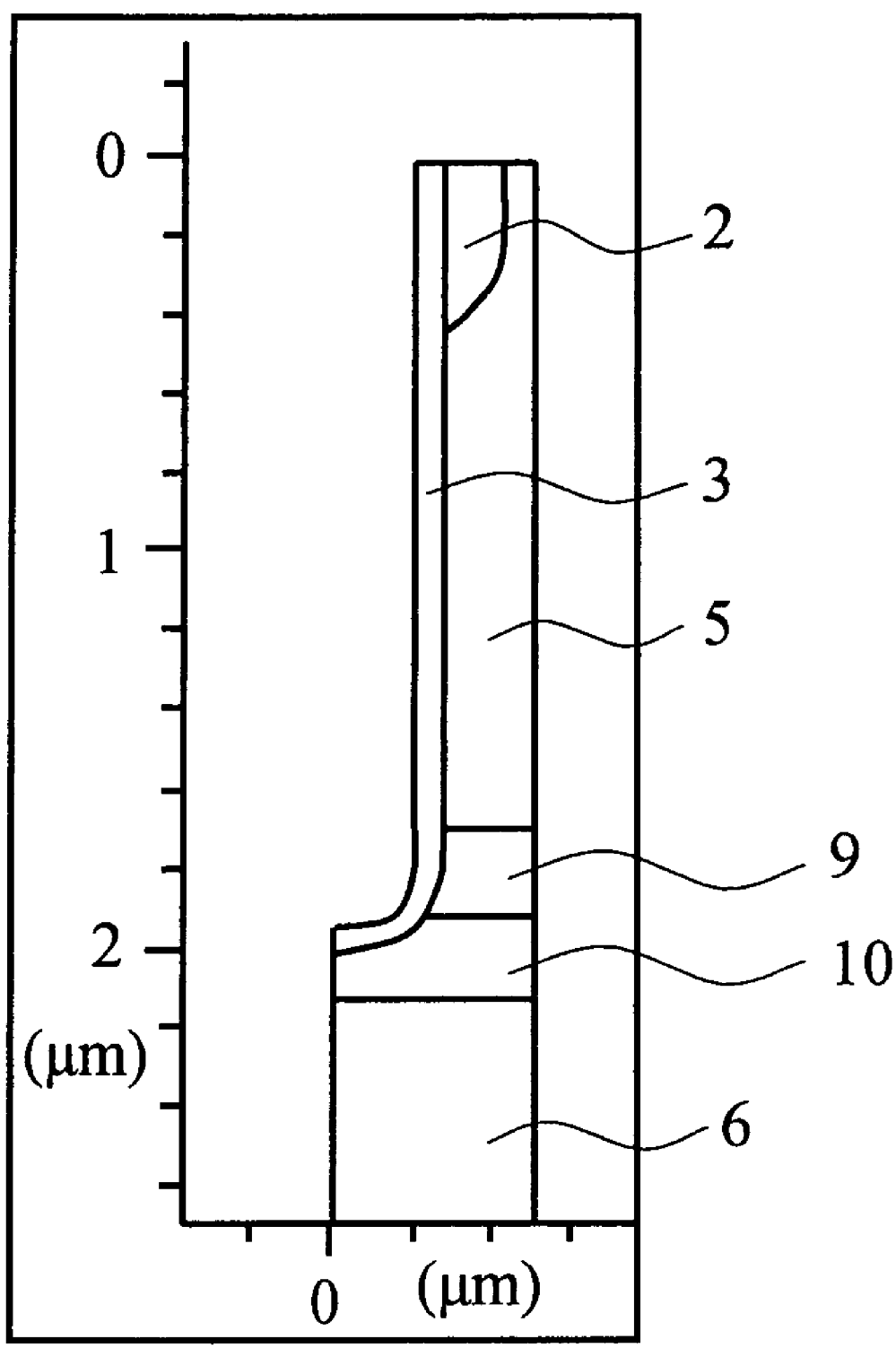
FIG. 3 is a schematic diagram which illustrates "structure A"

Here, "structure A" corresponds to the structure of this embodiment. The "structure A" is the structure where the n type region 9 and the p type region 10 are provided as shown in FIG. 3. The layer thicknesses of the n type region 9 and the p type region 10 are 0.2 micrometers, respectively. The junction part of these regions 9 and 10, i.e., p-n junction, shall be located at a position higher than the bottom of the trench gate by 0.1 micrometers.

Figure 4:
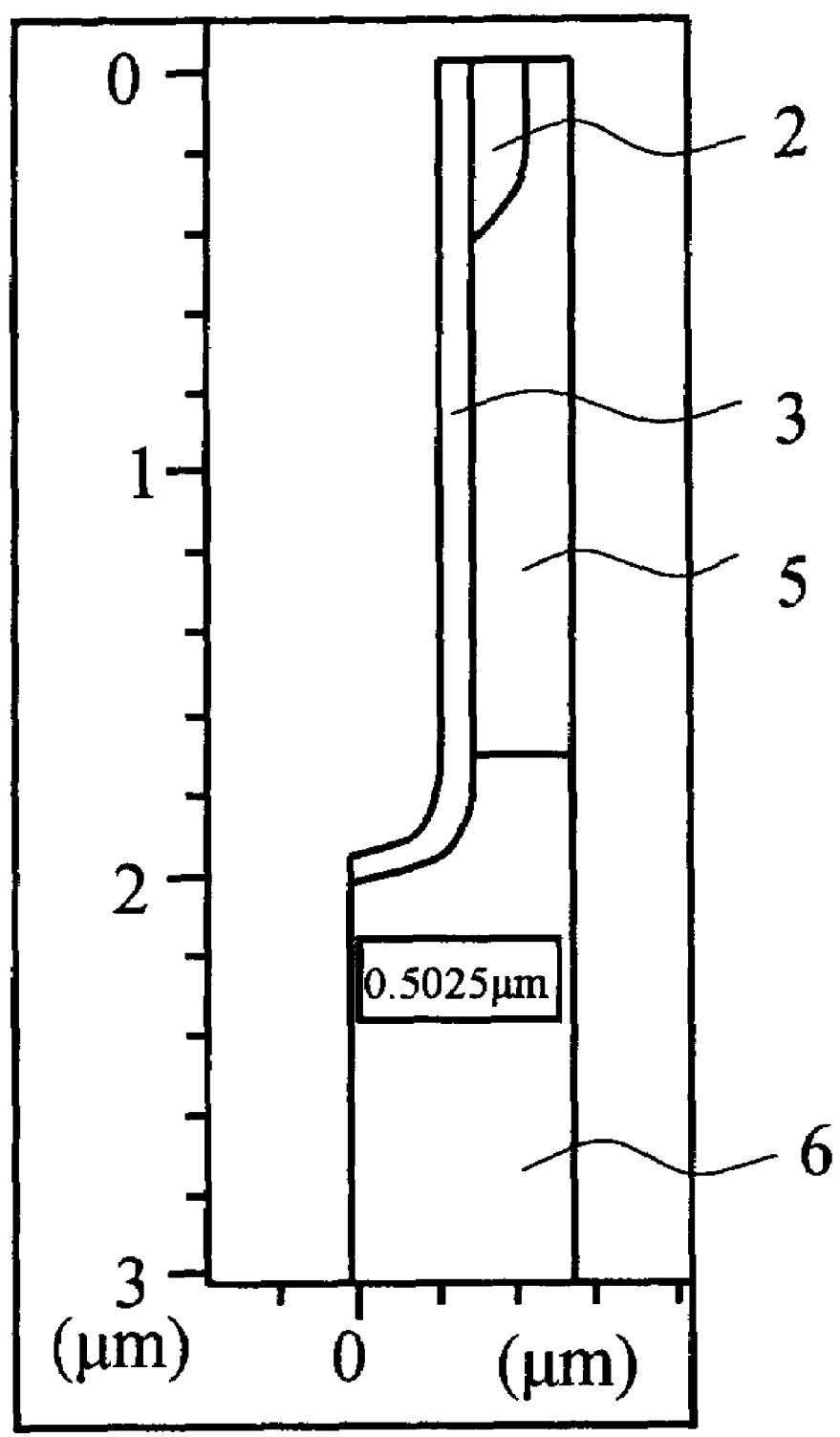
FIG. 4 is a schematic diagram which illustrates "structure B"

On the other hand, as shown in FIG. 4, in "structure B", the n type region 9 and the p type region 10 are not provided, but the p type base region is laminated directly on the n type epitaxial region 6.

In both structures, the cell pitch is 1.05 micrometers, the width of the trench is 0.55 micrometers, and the depth of the trench is 2 micrometers. The carrier concentration of the p type base region 5 is set to $7 \times 10^{16}/cm^3$, and the carrier concentration of the epitaxial region 6 is set to $1.2 \times 10^{16}/cm^3$.

In Table 1, the breakdown voltage Vb is defined as the drain voltage Vd at the time of the drain current being 1 μA, on the condition that Vs=Vg=0V. The threshold (Vth) is defined as a voltage obtained when the drain current becomes 1 mA and the drain voltage Vd is 10V. The ON resistance (Ron) is defined as a resistance obtained when the drain current is 100 mA and the gate voltage is 10V. Furthermore, each capacitance value ($C_{out}$, Cgd, Cds, Cgg) is defined as a capacitance obtained when the drain voltage Vd is 0.05V and a modulation of 1 MHz is given. Moreover, $C_{out}$ corresponds to (Cgd+Cds), and Cgg corresponds to (Cgd+Cgs).

From the Table 1, it can be seen that a big difference is not seen in the breakdown voltage and the threshold (Vth) between any of "structure A" and "structure B." That is, even if the n type region 9 and the p type region 10 are provided, there is no tendency in the breakdown voltage and in the threshold to deteriorate.

On the other hand, with regard to the ON resistance (Ron), there is a tendency to become higher in the "structure A"

Figure 5:
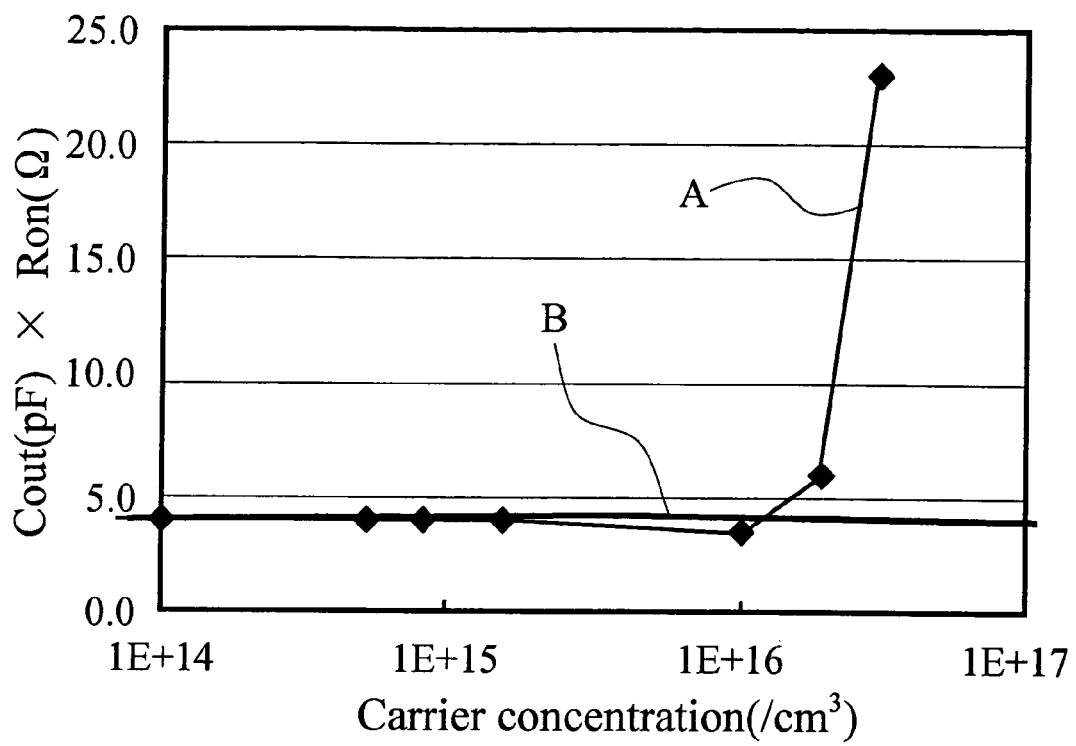
FIG. 5 is a graphical representation where $C_{out} \times R$ multiplication values are plotted to the carrier concentration of the n type region 9 and the p type region 10.

FIG. 5 is a graphical representation where CR multiplication values ($C_{out} \times R_{on}$) are plotted to the carrier concentration of the n type region 9 and the p type region 10.

Figure 6:
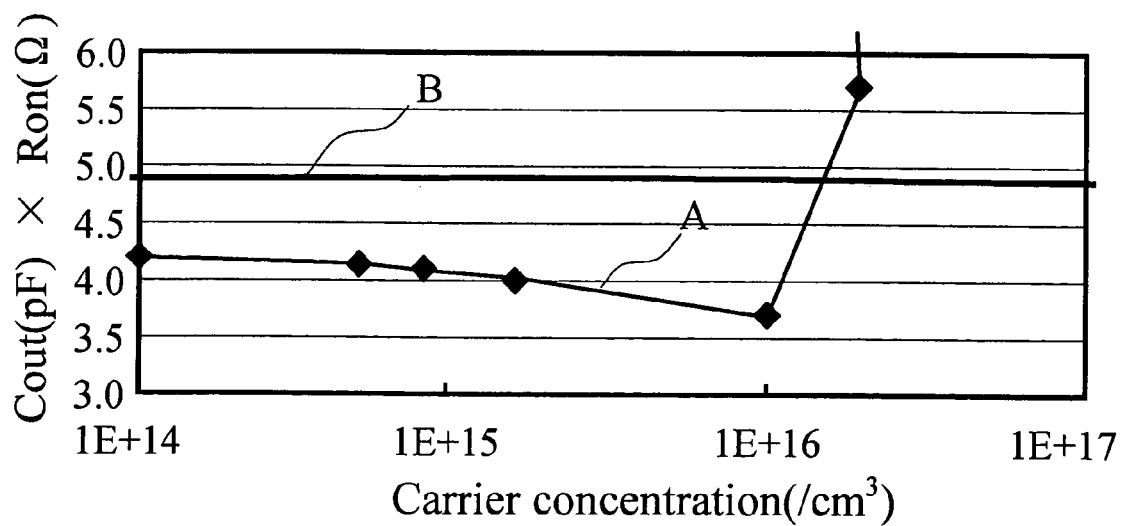
FIG. 6 is a graphical representation showing an enlarged part of FIG. 5.

FIG. 6 is a graphical representation showing an enlarged part of FIG. 5.

These graphs show that the CR multiplication value ($C_{out} \times R_{on}$) of "structure A" becomes lower than the CR multiplication value of "structure B", when carrier concentrations of the n type region 9 and the p type region 10 of the "structure A" are made lower than $2 \times 10^{16}/cm^3$. That is, it turns out that it is desirable to make the carrier concentrations of the n type region 9 and the p type region 10 lower than $2 \times 10^{16}/cm^3$ when it is especially required to lower the CR multiplication value.

Next, the parasitic capacitance will be explained.

Figure 7:
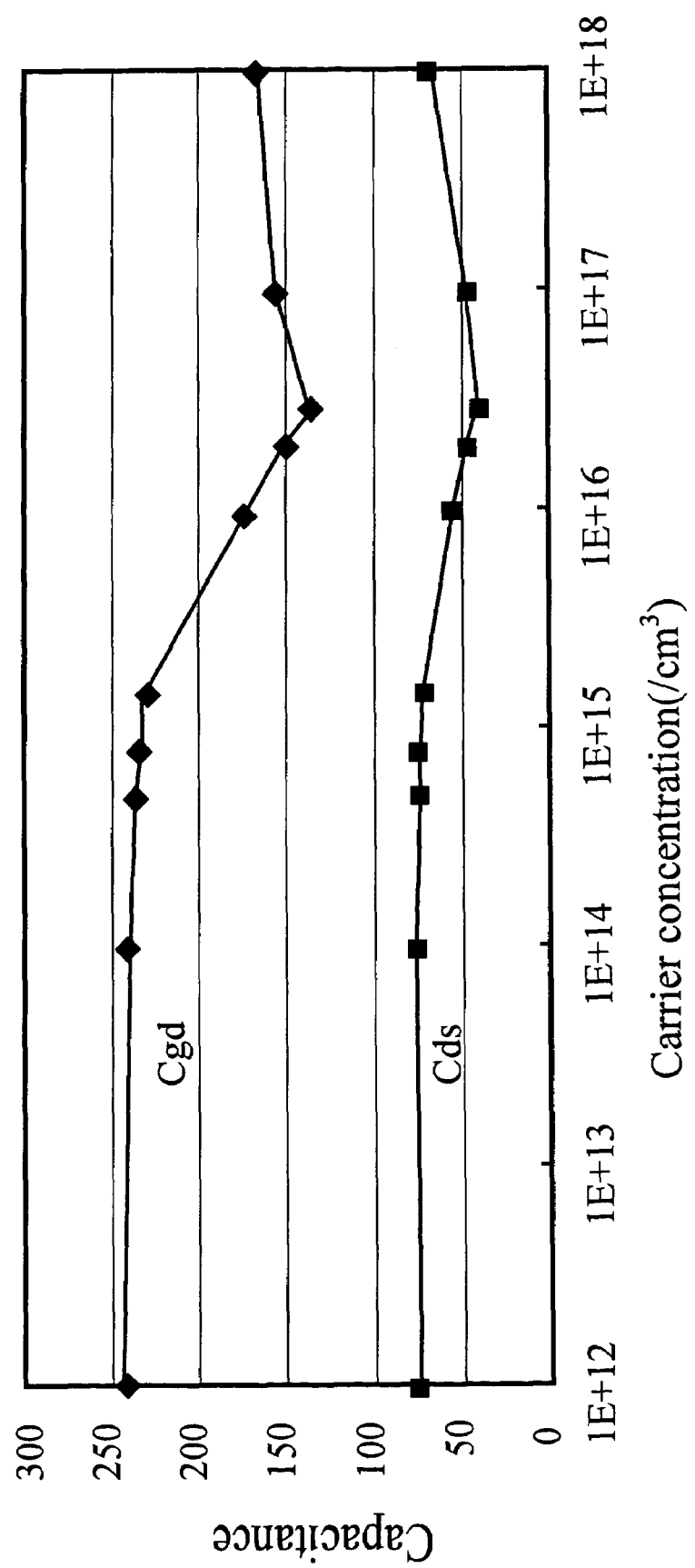
FIG. 7 is a graphical representation which expresses the dependency of the parasitic capacitance on the carrier concentration in "structure A"
Figure 8:
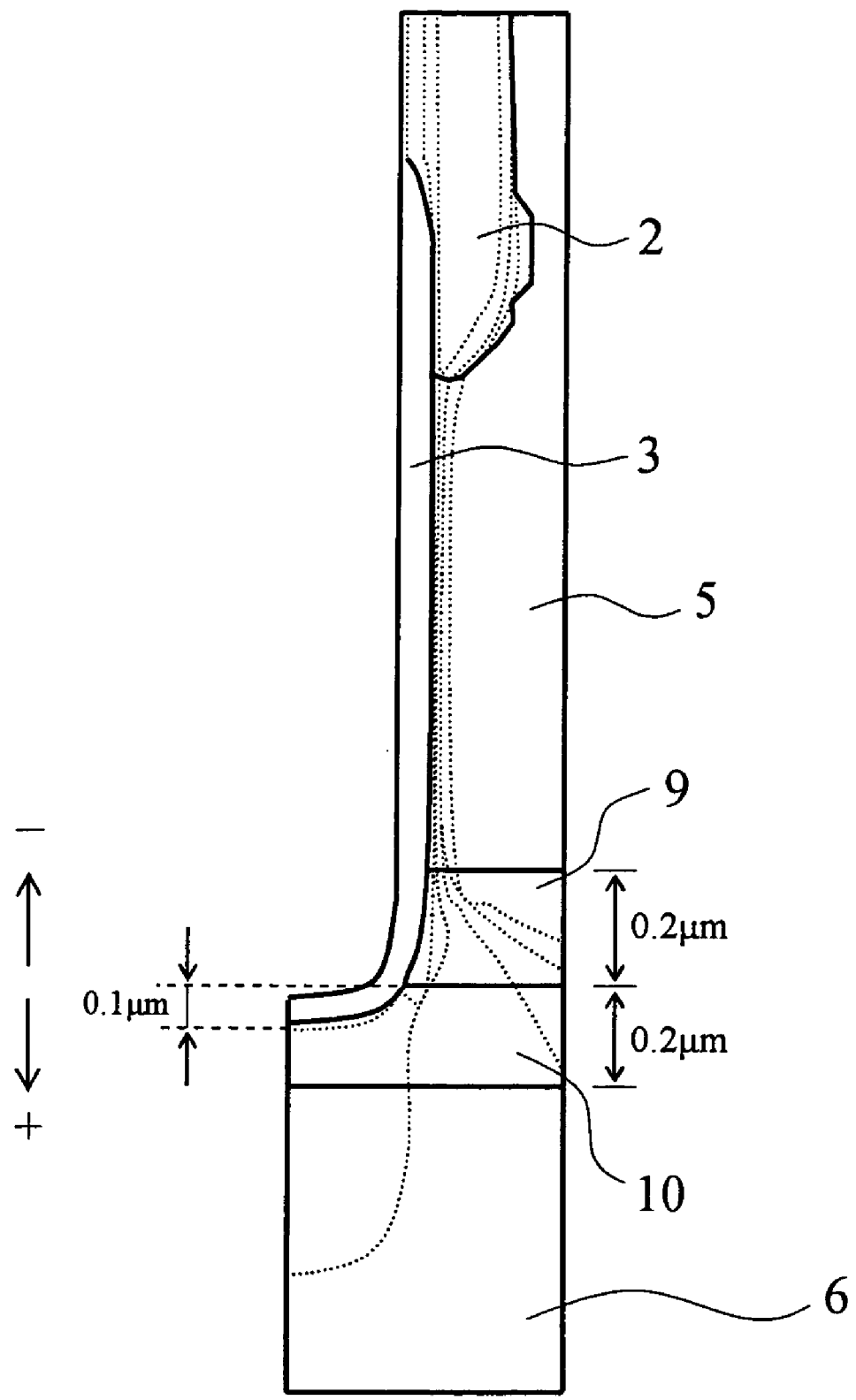
FIG. 8 is a schematic diagram illustrating the case where the p-n junction between the regions 9 and 10 is located at a position higher than the bottom of the trench gate by 0.1 micrometers.

FIG. 7 is a graphical representation which expresses the dependency of the parasitic capacitance on the carrier concentration in "structure A." That is, the vertical axis of this graph expresses the capacitance Cgd between the drain and the gate, and the capacitance Cds between the drain and the source, and the horizontal axis expresses the carrier concentration of the n type region 9 and the p type region 10.

In the range shown in Table 1, although both the Cgd and the Cds are lower than those of "structure B." As seen in FIG. 7, these capacitance components become minimum when the carrier concentration is about $3 \times 10^{16}/cm^3$. If the carrier concentration becomes higher than this value, the n type region 9 and the p type region 10 can not be completely depleted, and the capacitance rise again.

Now, the formation of the depleted regions will be explained more concretely. When the extending distance W of the depleted region from the p-n junction can be expressed by the following formula:

$$W = (2\epsilon s V bi/qNd)^{1/2}$$

where, εs is the permittivity of the semiconductor device, Vbi is the built-in potential, q is the electric charge, and Nd is the carrier concentration, respectively. When Vbi is 0.7V, the extending distances W of the depleted region are as the following:

| Nd | W |
| --- | --- |
| $1 \times 10^{15}/cm^3$ | about 0.78 micrometers |
| $7 \times 10^{15}/cm^3$ | about 0.5 micrometers |
| $1 \times 10^{16}/cm^3$ | about 0.3 micrometers |
| $1 \times 10^{17}/cm^3$ | about 0.11 micrometers |

That is, the distance of the depleted region extending to the n type region 9 and the p type region 10 becomes smaller as the carrier concentration increases. For example, when the thicknesses of the layer of the n type region 9 and the p type region 10 are 0.2 micrometers, respectively, if the carrier concentration is made lower than $1\times10^{16}/cm^3$, these regions can be depleted completely. However, if the carrier concentration is more than $1\times10^{17}/cm^3$, it becomes impossible for these regions to be depleted completely. Therefore, it is desirable to make the carrier concentrations of the n type region 9 and the p type region 10 low to some extent.

However, in an actual manufacture process, it is not easy to form the n type region 9 and the p type region 10 whose carrier concentrations are stably much less than those of the base region 5 and the epitaxial region 6 in many cases. Rather, it is easy for manufacture process to make the carrier concentrations of these regions close to the carrier concentration of the base region 5 or the epitaxial region 6.

Therefore, in order to obtain the semiconductor device whose parasitic capacitance component is especially low, it is desirable to make the carrier concentrations of the n type region 9 and the p type region 10 within the limits of $5\times10^{15}$ through $3\times10^{16}/cm^3$.

Next, the condition of the location of the n type region 9 and the p type region 10 will be explained.

Table 2 shows the relationship between the locations of the n type region 9 and the p type region 10, and the characteristics of the semiconductor device.

Since the product of ($C_{out}\times R_{on}$) becomes the best when the junction part of these regions 9 and 10, i.e., p-n junction, is located at a position higher than the bottom of the trench gate by 0.1 micrometers, this position is defined as "0 micrometer" as the standard of "junction position". The case where the p-n junction is lower than this standard is defined as "plus", and the upper case is defined as "minus."

Figure 9:
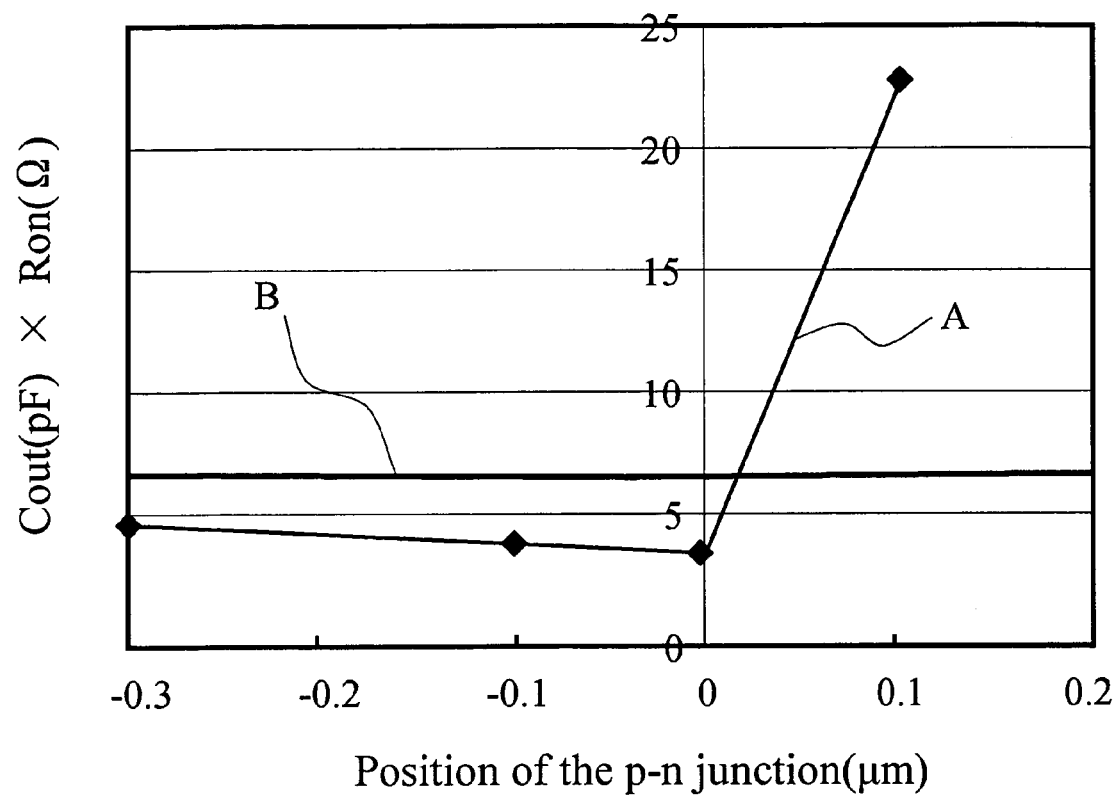
FIG. 9 is a graphical representation showing the relationship between the CR multiplication value ($C_{out} \times R_{on}$) and the position of the p-n junction.

FIG. 9 is a graphical representation showing the relationship of the CR multiplication value ($C_{out}\times R_{on}$) over the position of the p-n junction. From this graph, it is seen that the CR multiplication value ($C_{out}\times R_{on}$) increases when the position of the p-n junction shifts toward the "plus" direction, i.e., to a lower position. This is because although the parasitic capacitance $C_{out}$ falls, the ON resistance Ron increases to cancel the effect of the fall.

On the other hand, the graph shows that the CR multiplication value is lower than that of "structure B" and the good characteristics are acquired when the position of the p-n junction shifts to the "minus" direction, i.e., to a higher position.

Figure 10:
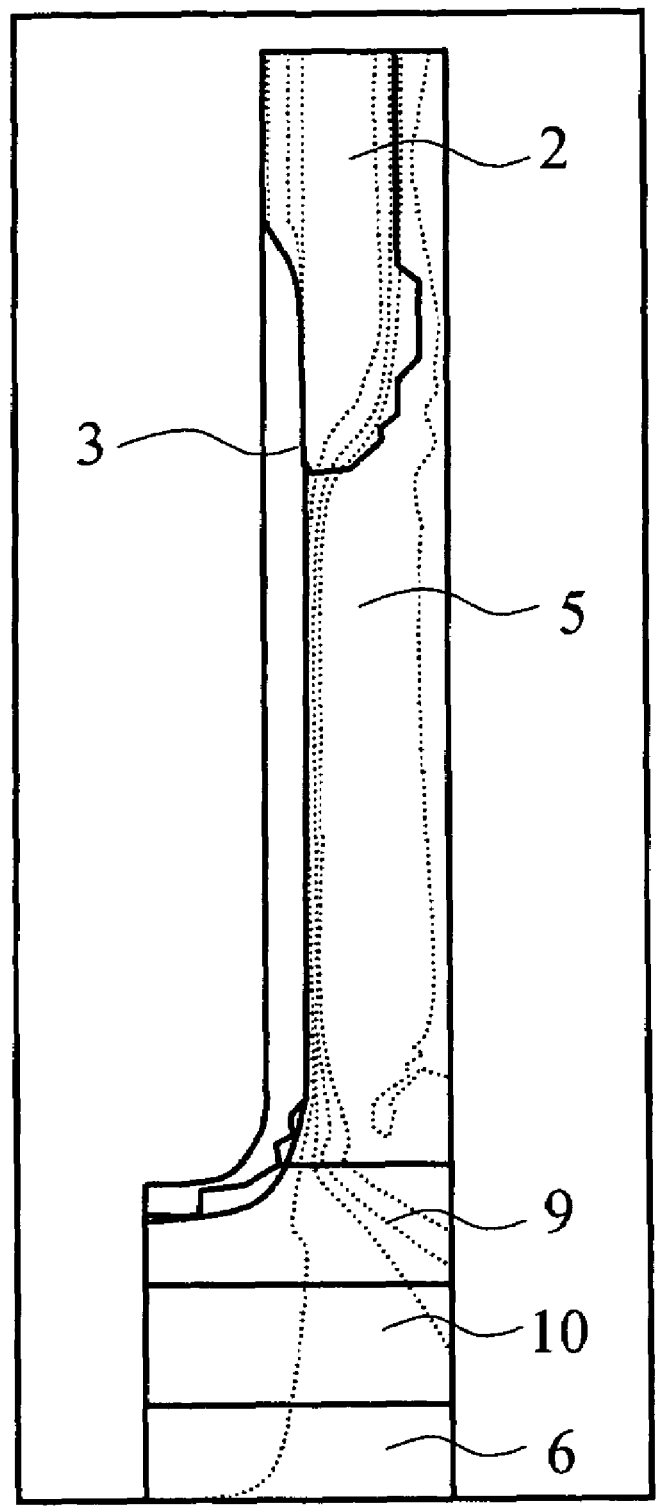
FIG. 10 is a schematic diagram showing the current distribution in case where the position of the p-n junction is at plus 0.2 micrometers.

FIG. 10 is a schematic diagram showing the current distribution in case where the position of the p-n junction is at plus 0.2 micrometers.

Figure 11:
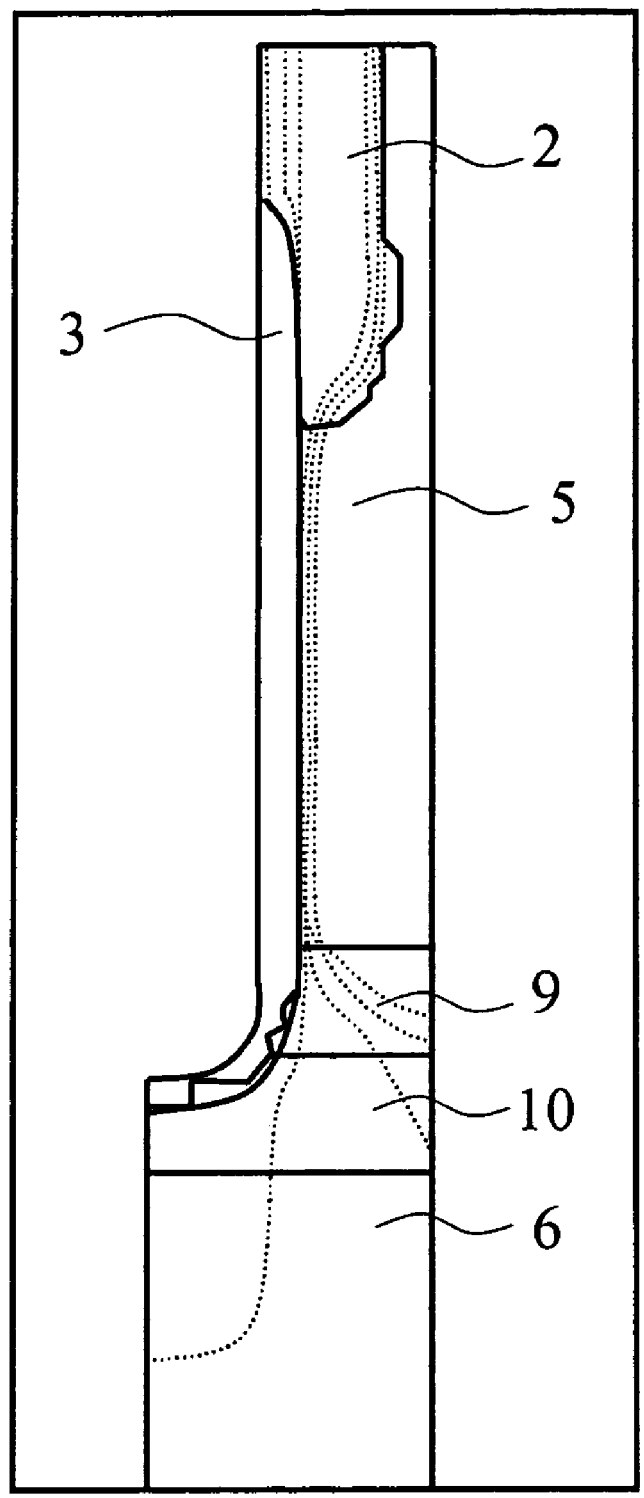
FIG. 11 is a schematic diagram showing the current distribution in case where the position of the p-n junction is at zero micrometer.
Figure 12:
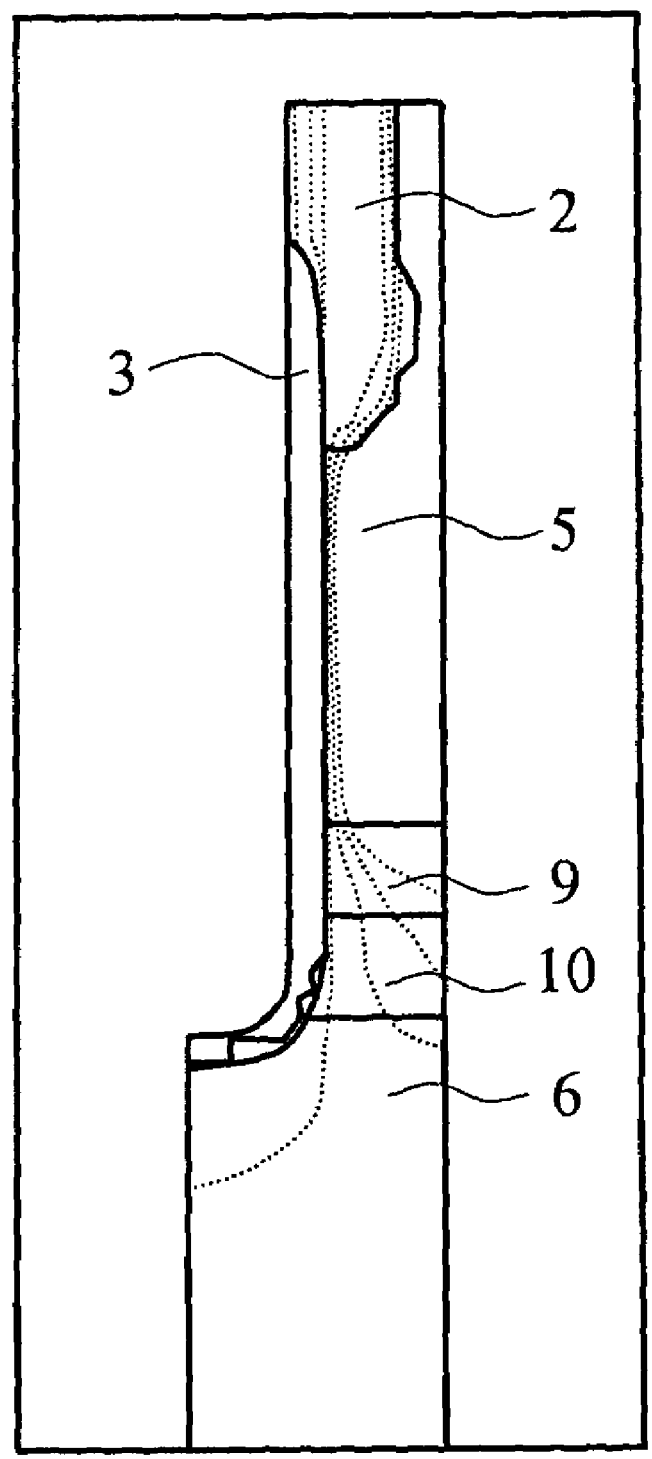
FIG. 12 is a schematic diagram showing the current distribution in case where the position of the p-n junction is at minus 0.2 micrometers.

And, FIGS. 11 and 12 are schematic diagrams showing the current distributions in cases where the positions of the p-n junction are at zero and at minus 0.2 micrometers, respectively.

An inversion channel region is formed in the semiconductor region of the circumference of the trench gate by applying a bias to the trench gate. However, as shown in FIG. 10, if the n type region 9 and the p type region 10 which are depleted have shifted to a position lower rather than the bottom of the trench, the barrier over the current is formed, since the inversion channel region will not be formed in the p type region 10. As the result, ON resistance will increase to 606 ohms ($\Omega$).

TABLE 2

| | Junction position | Vb | vth | Ron | Cout | Cgd | Cds | Cgg | Cout × Ron | FET area |
| --- | --- | --- | --- | --- | --- | --- | --- | --- | --- | --- |
| Structure A | 0 | 45 | 1.23 | 16.1 | 228 | 173 | 55 | 1786 | 3.7 | 1 mm$^2$ |
| | +0.1 µm | 45 | 1.3 | 122 | 185 | 116 | 69 | 1781 | 22.6 | 1 mm$^2$ |
| | +0.2 µm | 45.2 | 1.36 | 606 | 252 | 149 | 103 | 1724 | 152.7 | 1 mm$^2$ |
| | −0.1 µm | 45.3 | 1.21 | 12.9 | 314 | 260 | 54 | 1697 | 4.1 | 1 mm$^2$ |
| | −0.2 µm | 45 | 1.13 | 10 | 398 | 350 | 48 | 1678 | 4.0 | 1 mm$^2$ |
| | −0.3 µm | 45 | 1.06 | 10 | 466 | 421 | 45 | 1760 | 4.7 | 1 mm$^2$ |
| Structure B | — | 45.2 | 1.24 | 10 | 493 | 366 | 127 | 1863 | 4.9 | 1 mm$^2$ |
| | | Id = 1 mA Vd = Vs = 0 V | Id = 1 mA Vd = 10 V | Id = 100 mA Vg = 10 V | Accoupled method Vd = 0.05 V 1 MHz | | | | | |

Also, the "structure A" is the structure where the n type region 9 and the p type region 10 are provided as shown in FIG. 3. The layer thicknesses of the n type region 9 and the p type region 10 are 0.2 micrometers, respectively, and the both carrier concentrations are $1\times10^{16}/cm^3$. As mentioned above, in this condition, the n type region 9 and the p type region 10 are depleted completely.

On the other hand, the "structure B" is the structure where the n type region 9 and the p type region 10 are not provided as shown in FIG. 4.

In Table 2, the definition and the measurement conditions of the breakdown voltage Vb, Vth, $R_{on}$, $C_{out}$, Cgd, Cds and Cgg are the same as those of what were mentioned above about Table 1.

In contrast, as shown in FIG. 11, when the position of the p-n junction is at 0 (zero) micrometer, the ON resistance falls to 16.1 ohms, since a part of the p type region 10 is inverted by the gate bias and the current channel is formed.

Furthermore, as shown in FIG. 12, if the position of the p-n junction shifts to a higher position of minus 0.2 micrometers, the p type region 10 will touch the trench gate throughout its thickness range. That is, the inversion channel formed in the p type region 10 by the gate bias penetrates the p type region 10 vertically, and thus, a current path is kept.

As the result, the ON resistance falls to 10 ohms. This ON resistance is the same value as that of "structure" B, i.e., the case where the n type region 9 and the p type region 10 are not provided. That is, it turns out that the increase of the ON resistance produced by providing the p type region 10 can be completely cancelled.

As explained above, it is desirable to provide so that the p type region 10 may touch the trench gate throughout its thickness range from a viewpoint of the ON resistance.

On the other hand, with regard to the parasitic capacitance, the value lower than that of "structure B" is acquired when the position of the p-n junction is in the range from "plus 0.2 micrometers" to "minus 0.3 micrometers." However, when the position of the p-n junction is "minus 0.3 micrometers", $C_{out}$ increases up to 466 which is close to the $C_{out}$ of 493 of "structure B." As shown in FIG. 12, this is because the bottom of the trench gate penetrates the p type region 10 and projects below, and thus, the parasitic capacitance in this region cannot be reduced.

That is, when it is especially required to reduce the parasitic capacitance, it is desirable to provide the n type region 9 and the p type region 10 in the position so that the bottom of the trench gate locates within the p type region 10.

And as shown in Table 2 and FIG. 9, when the position of the p-n junction is at 0 (zero) micrometer, CR multiplication value ($C_{out} \times R_{on}$) becomes the minimum (3.7), and the remarkable improvement in performance is attained as compared with 4.9 of "structure B." The CR multiplication value shows that a desirable result is obtained when the bottom of the trench is in the region of the p type region 10 or the trench penetrates the p type region 10.

Now, in an actual manufacture process, after forming the p type region 10 and the n type region 9, the opening of the trench is formed and the gate is formed in many cases. Since some "variation" arises in the depth of the trench in this trench opening process, it is safe to set the position of the p-n junction to the upper position rather than the standard position of 0 micrometer, as shown in FIG. 13.

Figure 13:
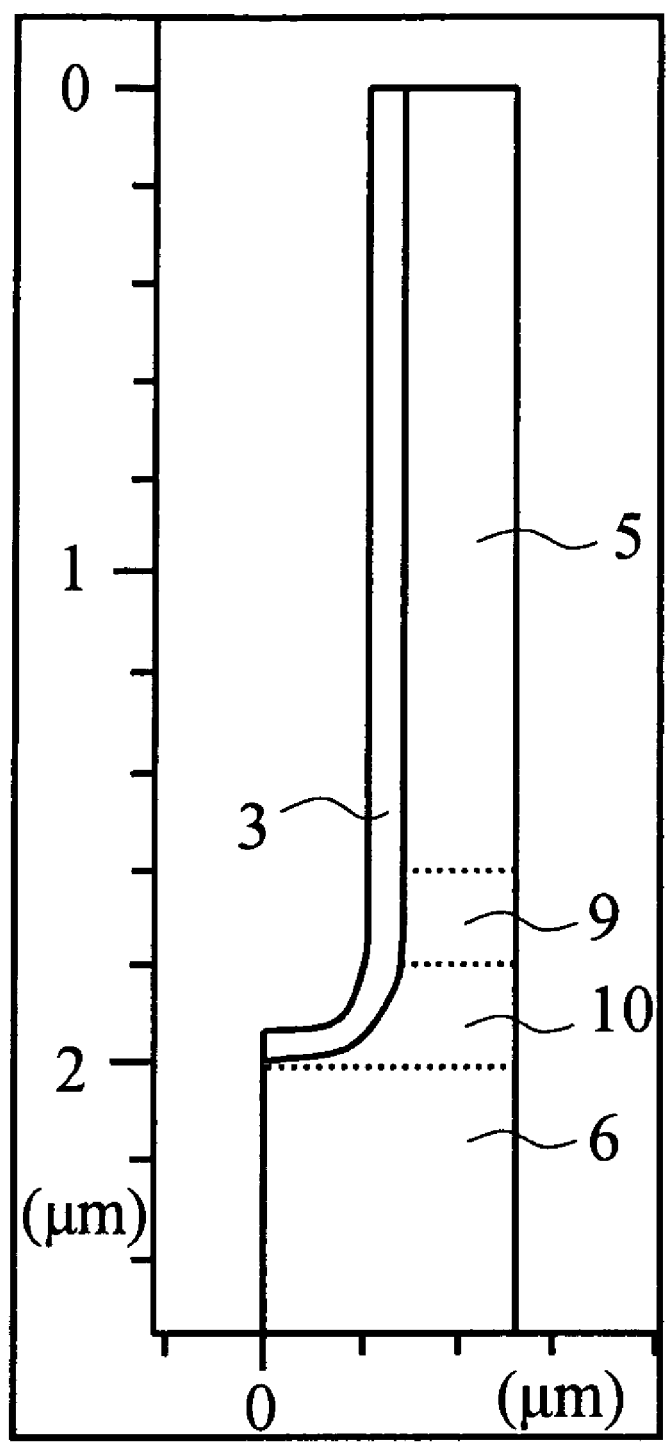
FIG. 13 shows the case where the position of the p-n junction is shifted to "minus 0.1 micrometers", i.e., upward by only 0.1 micrometers.

Here, FIG. 13 shows the case where the position of the p-n junction is shifted to "minus 0.1 micrometers", i.e., to a higher position by 0.1 s.

Thus, even when the trench is formed more shallowly than a preset value because of the "variation" in a formation process, the problem that the bottom of the trench does not reach the p type region 10 and the ON resistance Ron increases, as shown in FIG. 10, can be prevented by shifting the process setting position of the p-n junction higher than the optimal position.

As explained referring to FIG. 1 through FIG. 13, according to the embodiment, the parasitic capacitance of the semiconductor device can be reduced by providing the n type region 9 and the p type region 10 near the bottom of the trench gate and by depleting these regions during operation. As a result, the CR multiplication value ($C_{out} \times R_{on}$) can also be reduced and the trench gate type semiconductor device which is excellent in the operating characteristic can be offered.

In the above explanation, although the case where this embodiment is applied to MOSFET was mentioned as the examples, the present invention is not limited to these examples.

Figure 14:
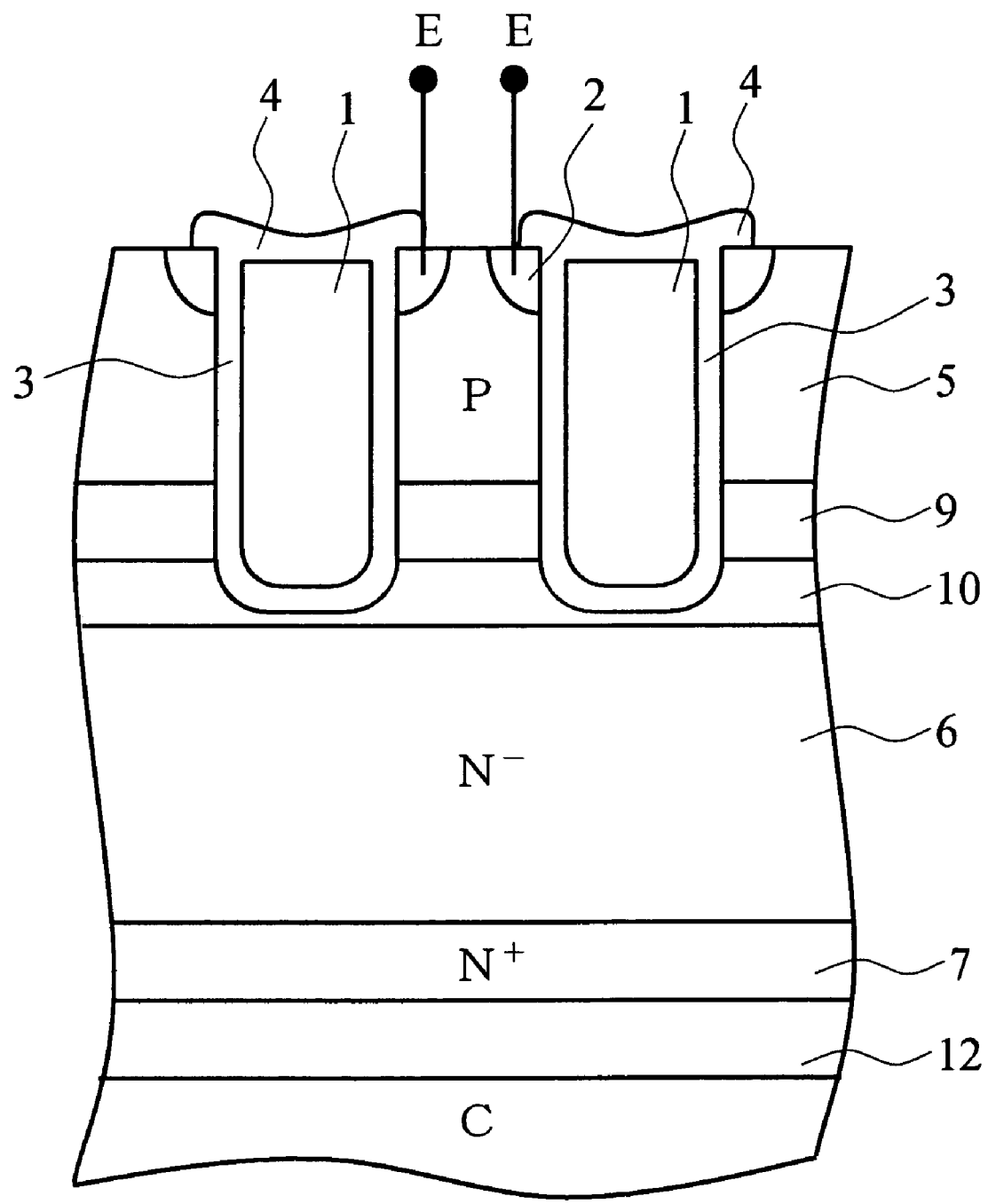
FIG. 14 is a schematic diagram illustrating the principal part section structure of IGBT according to the embodiment of the invention.

FIG. 14 is a schematic diagram illustrating the principal part section structure of IGBT according to the embodiment. The same symbols are given to the same elements as what were mentioned above with reference to FIG. 1 through FIG. 13 about this figure, and detailed explanation will be omitted.

In this IGBT, the emitter electrode E is connected to the n type source (emitter) region 2, the $p^+$ type collector region 12 is provided in the back side of the n type substrate 7, and the $p^+$ type collector region 12 is connected to the collector electrode C.

Also in such IGBT, by providing the n type region 9 and the p type region 10 and by depleting these regions during operation, the parasitic capacitance can be reduced and the trench gate type semiconductor device which is excellent in the operating characteristic can be offered.

Although the semiconductor device in which one layer of the n type region 9 and one layer of the p type region 10 are provided is illustrated in FIG. 1 through FIG. 14, the present invention is not limited to these examples.

Figure 15:
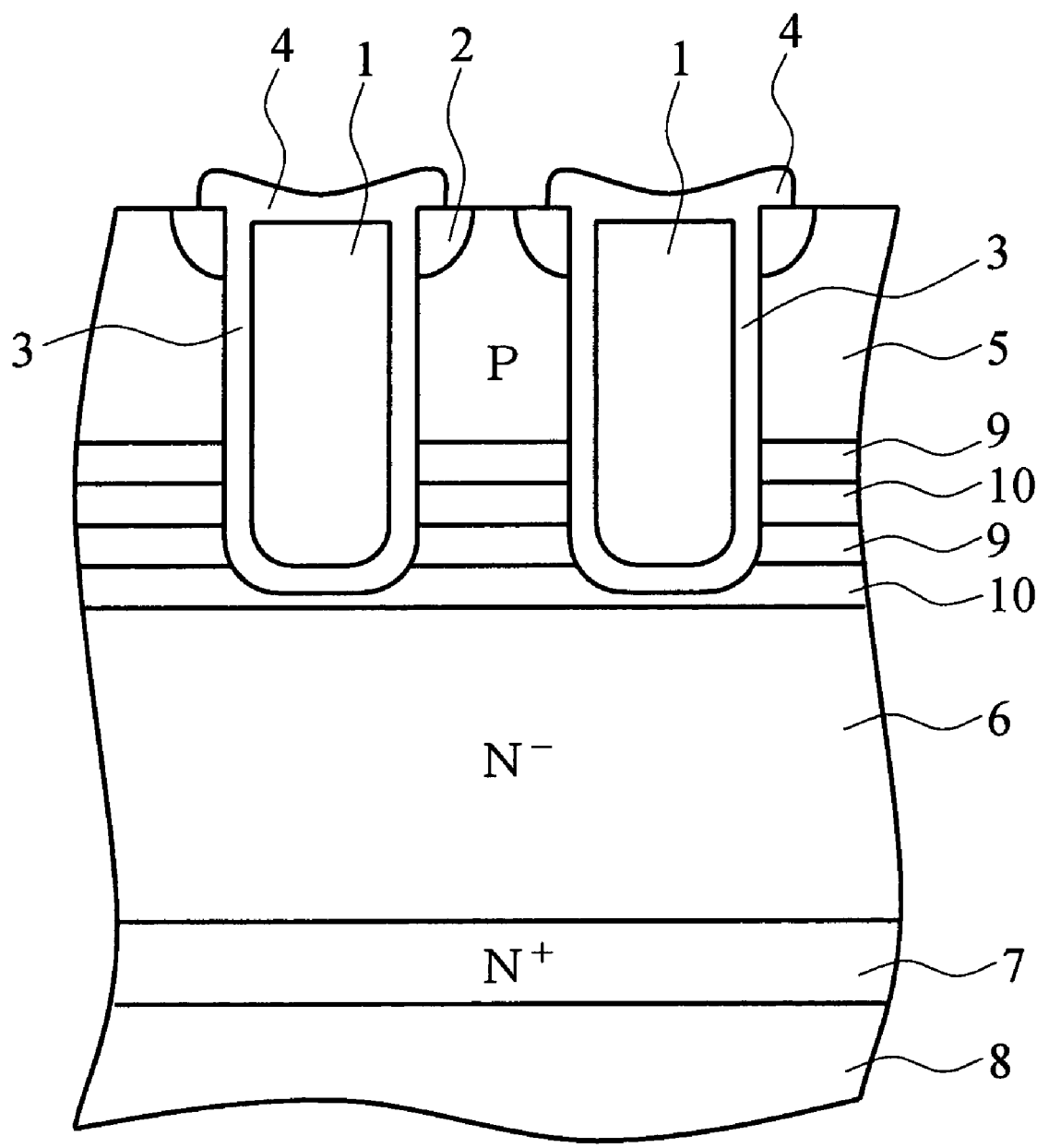
FIG. 15 is a schematic diagram showing the semiconductor device in which two layers of the n type regions 9 and two layers of the p type regions 10 are provided.

FIG. 15 is a schematic diagram showing the semiconductor device in which two layers of the n type regions 9 and two layers of the p type regions 10 are provided. The same symbols are given to the same elements as what were mentioned above with reference to FIG. 1 through FIG. 14 about this figure, and detailed explanation will be omitted.

In the case of the example of FIG. 15, two layers of the n type regions 9 and two layers of the p type regions 10 are provided by turns between the base region 5 and the epitaxial region 6. It is also possible to make all of the p type region 9 and the n type region 10 depleted even when the external bias voltage is zero, because the built-in potential of the p-n junction is formed between the n type region 9 and the p type region 10.

The number of the layers of the p type regions 9 and the n type regions 10 is not necessarily two as shown. That is, three or more layers of the p type regions and the n type regions of may be laminated by turns.

Thus, when two or more p type regions 9 and n type regions 10 are laminated, thickness of the each layer can be made thin. That is, the depleted region DP as shown in FIG. 2 can be formed by dividing into two or more p type regions 9 and the n type regions 10 of thin layers. As the result, it becomes easier to make each layer of the p type region 9 and the n type region 10 depleted completely, and there is an advantage that restrictions of the carrier concentration for forming the depleted region DP etc. are eased.

(Second Embodiment)

Next, the semiconductor device where the current path is kept by providing the n type region in the circumference of the trench gate and the parasitic capacitance is reduced while controlling the increase of the ON resistance will be explained as a second embodiment of the invention.

Figure 16:
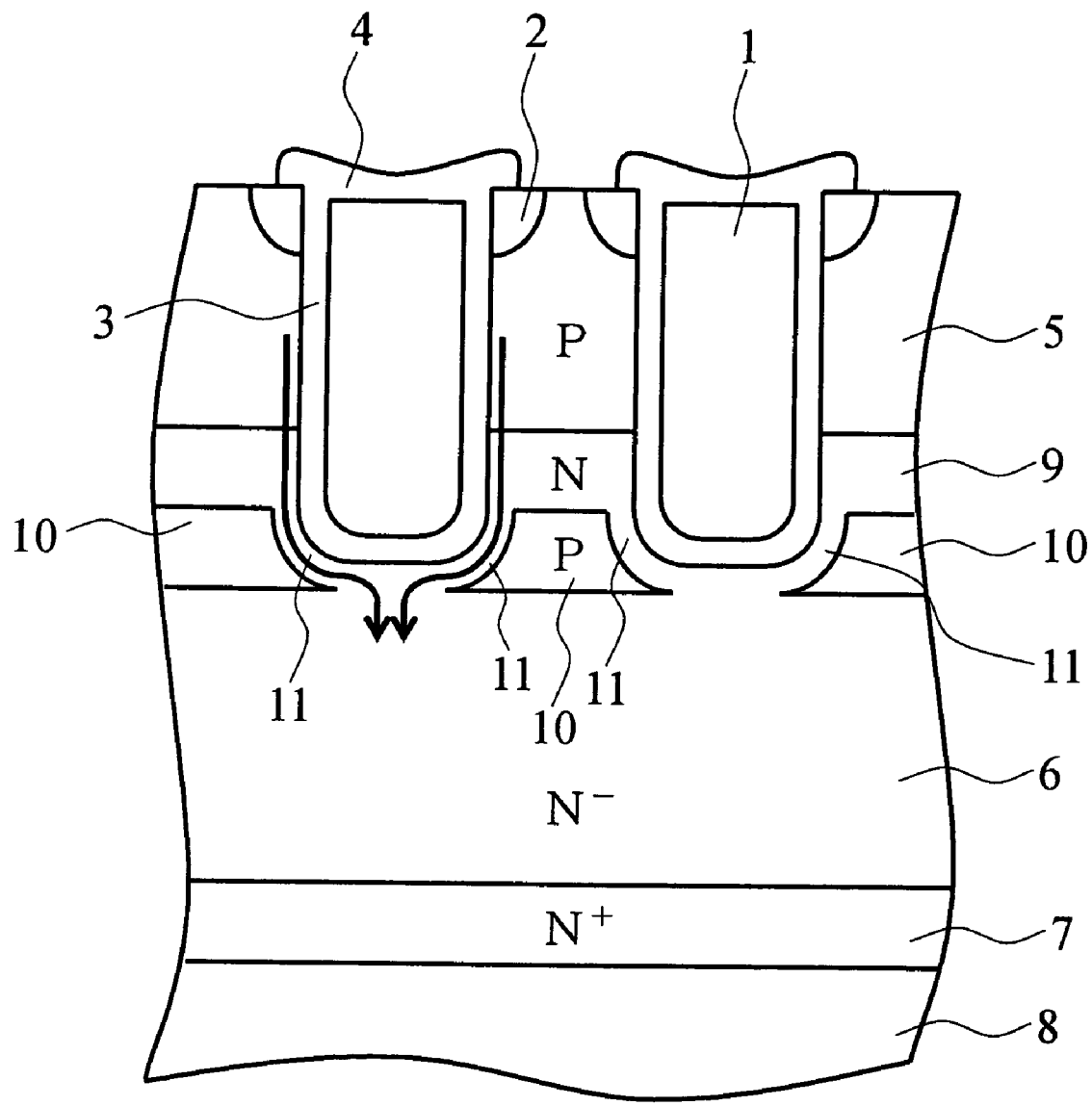
FIG. 16 is a schematic diagram illustrating the cross-sectional structure of the first semiconductor device according to the second embodiment of the invention.

FIG. 16 is a schematic diagram illustrating the cross-sectional structure of the first semiconductor device according to the embodiment. The same symbols are given to the same elements as what were mentioned above with reference to FIG. 1 through FIG. 15 about this figure, and detailed explanation will be omitted.

In this example, the p type region 10 is provided apart from the trench gate, and the n type region 11 is provided among these. Then, as illustrated by the arrows in this figure, the path of channel current will be kept. That is, according to this embodiment, the increase of the ON resistance by the p type region 10 which was mentioned above about FIG. 10 can be prevented certainly.

And the depleted region is extended from the p-n junction formed between the p type region 10, and the n type regions 9 and 11 which adjoin the p type region 10. Since the depleted region makes the circumference of the trench gate depleted as shown in FIG. 2, the parasitic capacitance decreases. That is, according to this embodiment, it is certainly possible to reduce the parasitic capacitance preventing the increase of the ON resistance. As the result, the CR multiplication value ($C_{out} \times R_{on}$) can be reduced and the semiconductor device with high performance can be offered.

In addition, as a manufacturing method of the semiconductor device of this example, the following methods can be used, for example.

First, the method of diffusing the n type impurities from the inner wall of the trench can be mentioned as the first method. That is, after forming the p type region 10, the n type region 9 and the p type base region 5, the opening of the trench is carried out. Then, the n type region 11 can be formed by introducing the n type impurity into the surrounding of the semiconductor region from the inner wall of the trench.

On the other hand, the method of forming by introducing impurities alternatively can be mentioned as the second method. That is, the p type region 10 which is expressed in FIG. 16 can be formed by introducing the p type impurity selectively by methods, such as ion implantation before or after the formation of the trench. Alternatively, the n type region 11 may be formed by introducing the n type impurity selectively after forming a continuous layer of the p type region.

Figure 17:
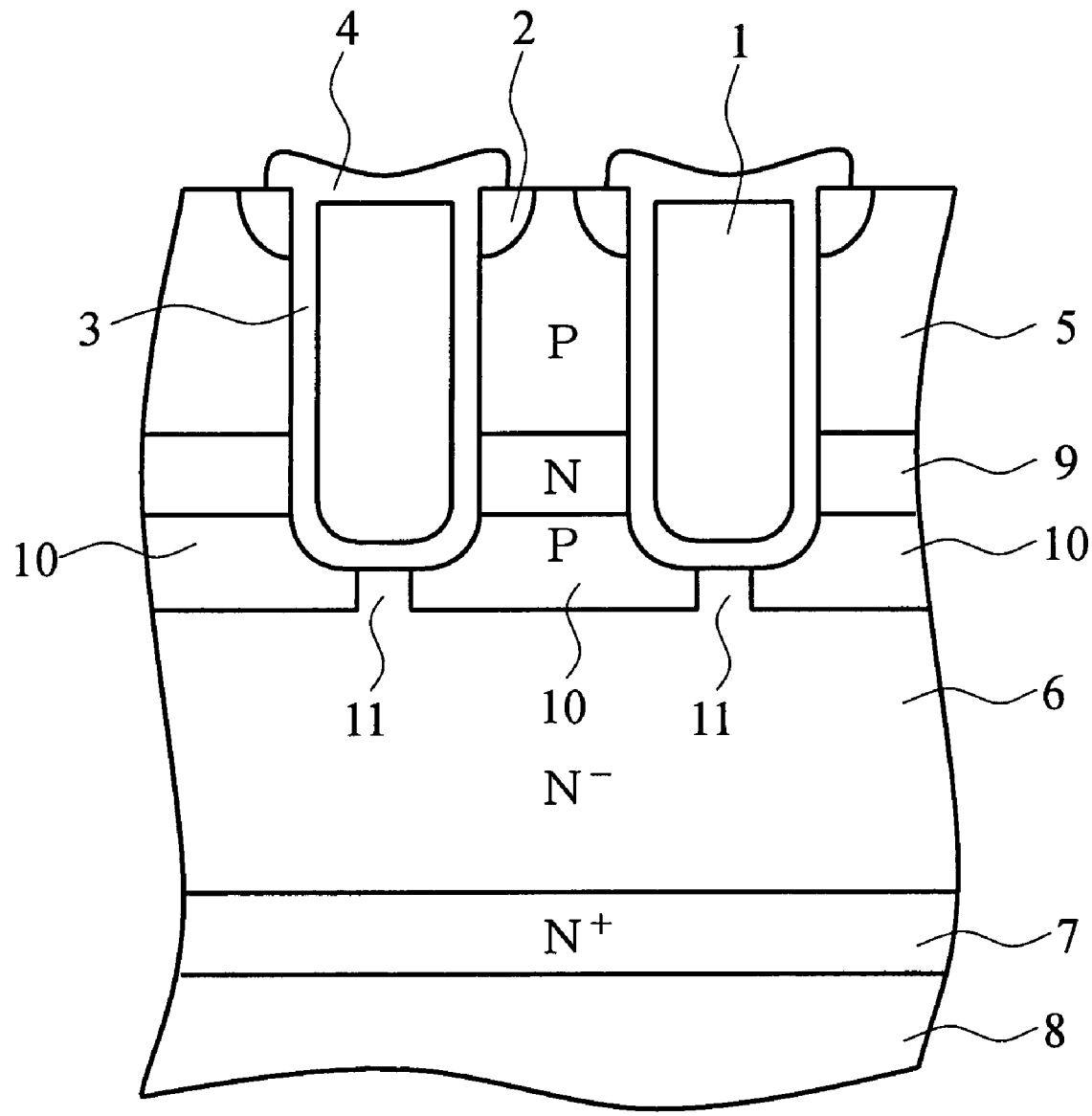
FIG. 17 is a schematic diagram illustrating the cross-sectional structure of the second semiconductor device according to the second embodiment of the invention.

FIG. 17 is a schematic diagram illustrating the cross-sectional structure of the second semiconductor device according to this embodiment. The same symbols are given to the same elements as what were mentioned above with reference to FIG. 1 through FIG. 16 about this figure, and detailed explanation will be omitted.

In this example, the p type region 10 is in contact with the side of the trench gate, but it is not in contact with the bottom of the trench gate, and the n type region 11 is provided instead.

By applying the gate bias, the inversion channel is also formed in the p type region 10 in contact with the trench gate, and the current path is formed. Such an inversion channel is formed in the region in contact with the side and the bottom of the trench gate, and does not reach the region separated down from the bottom of the trench gate.

On the other hand, in the lower region of the trench with which this inversion channel does not reach, the current path can be kept by providing the n type region 11 and the increase of the ON resistance can be certainly prevented in this embodiment.

On the other hand, as shown in FIG. 2, the depleted region is extended from the p-n junction formed between the p type region 10 and the n type region of the circumference of the p type region 10. As the result, the area near the bottom of the trench gate is covered with the depleted region, and the parasitic capacitance can be reduced sharply.

Figure 18:
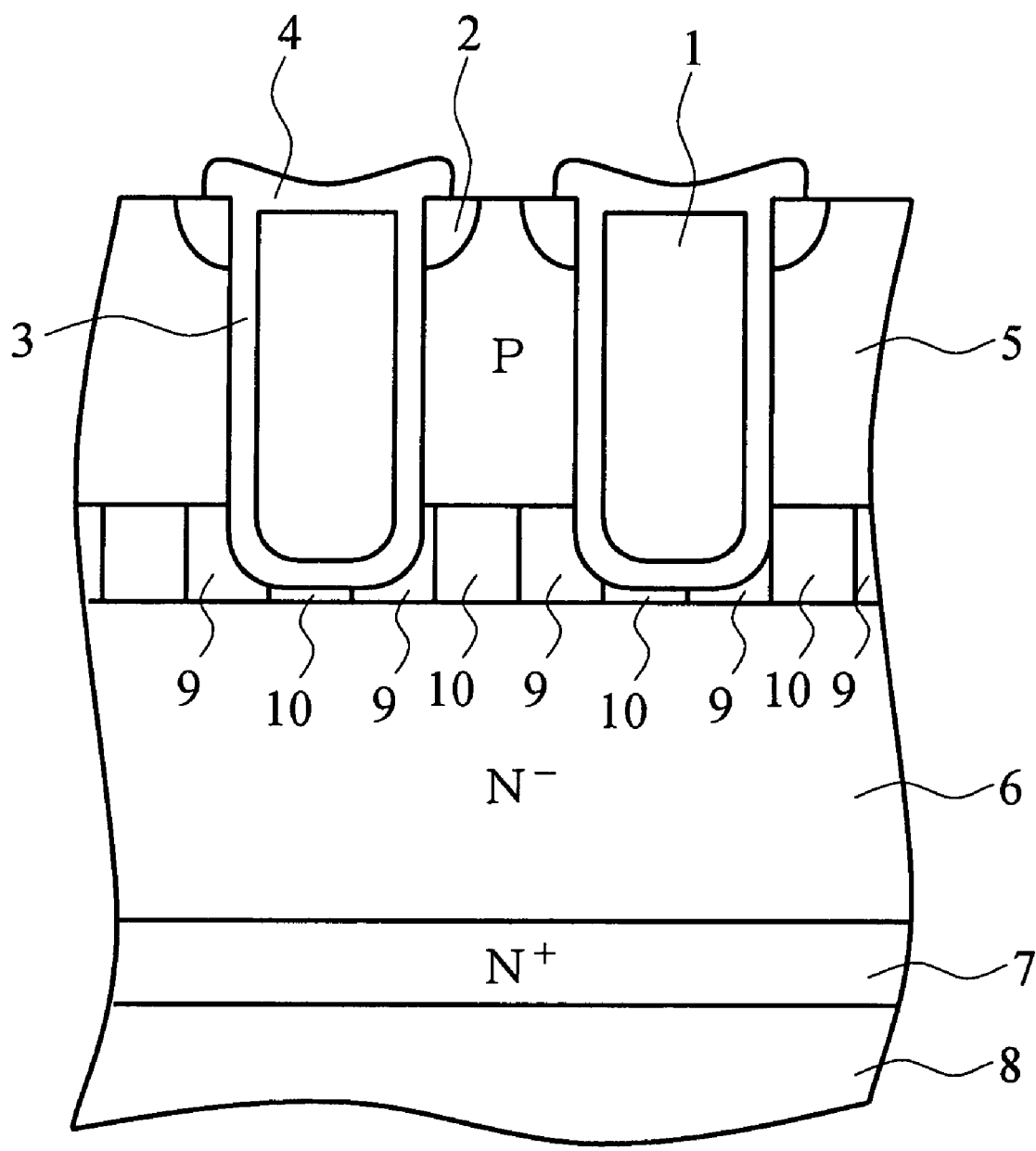
FIG. 18 is a schematic diagram illustrating the cross-sectional structure of the third semiconductor device according to the second embodiment of the invention.

FIG. 18 is a schematic diagram illustrating the cross-sectional structure of the third semiconductor device according to this embodiment. The same symbols are given to the same elements as what were mentioned above with reference to FIG. 1 through FIG. 17 about this figure, and detailed explanation will be omitted.

In this example, a plurality of the n type regions 9 and a plurality of the p type regions 10 are arranged by turns in the horizontal directions which are perpendicular to the depth direction of the trench gate.

Figure 19:
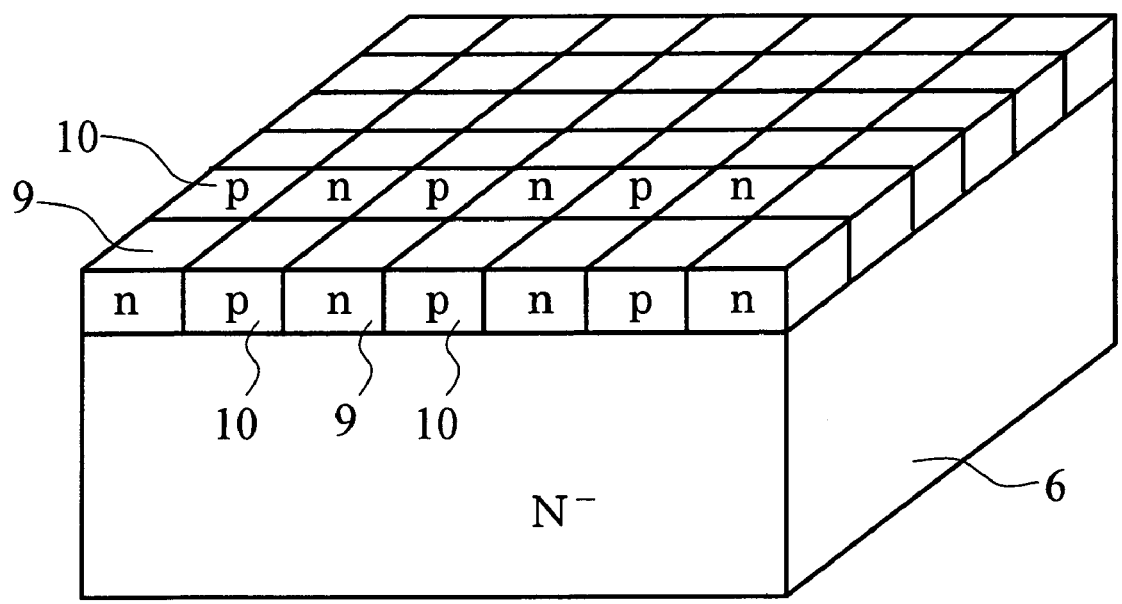
FIG. 19 is a schematic diagram illustrating the two-dimensional arrangement pattern of the n type regions 9 and the p type regions 10.
Figure 20:
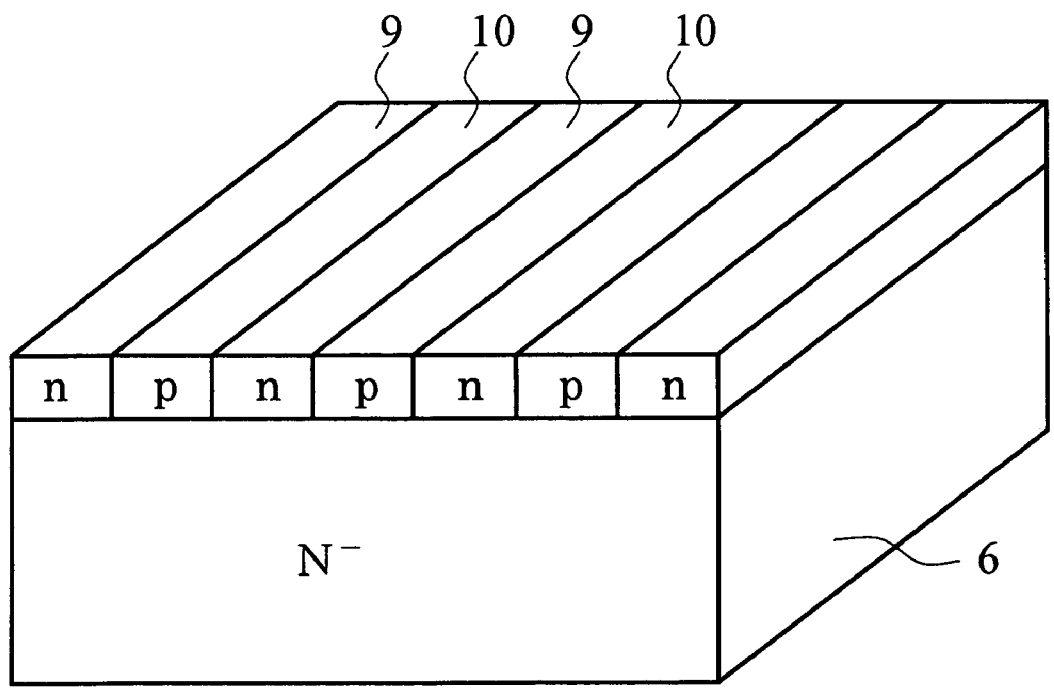
FIG. 20 is a schematic diagram illustrating the another two-dimensional arrangement pattern of the n type regions 9 and the p type regions 10.

FIGS. 19 and 20 are schematic diagrams illustrating the arrangement patterns of the n type regions 9 and the p type regions 10 of the semiconductor device shown in FIG. 18. That is, these figures are perspective diagrams showing that the n type regions 9 and the p type regions 10 are arranged on the n type epitaxial region 6.

As shown in FIG. 19, the n type regions 9 and the p type regions 10 can be provided by turns along with the two diagonal directions on the n type epitaxial region 6. Or, as shown in FIG. 20, the n type regions 9 and the p type regions 10 may be formed in the shape of stripes respectively, and may be arranged by turns on the n type epitaxial region 6. Such structures where the n type regions 9 and the p type regions 10 are arranged by turns on a plane can be formed by introducing impurities selectively with ion implantation, for example.

In these structures of the example, the sizes and the carrier concentrations of the n type regions 9 and the p type regions 10 are set so that they may be appropriately depleted by the p-n junction formed therebetween.

For example, as mentioned above about the first embodiment, when the carrier concentrations of the n type regions 9 and the p type regions 10 are $1 \times 10^{16}/m^3$, respectively, the region of 0.3 micrometers from the p-n junction is depleted at zero bias condition. Therefore, if the size along the horizontal direction (it is a direction perpendicular to the depth direction of the trench) of the n type regions 9 and the p type regions 10 is 0.6 micrometers or less, the n type regions 9 and the p type regions 10 will be successfully depleted by the p-n junction therebetween.

Similarly, when the carrier concentrations of the n type regions 9 and the p type regions 10 are $1 \times 10^{17}$ cm$^3$, respectively, the region of 0.11 micrometers from the p-n junction is depleted at zero bias condition. Therefore, if the size along the horizontal direction of the n type regions 9 and the p type regions 10 is 0.2 micrometers or less, the n type regions 9 and the p type regions 10 will be depleted by the p-n junction therebetween.

Thus, in this example, it is easy to make these regions depleted completely by appropriately setting the size along the horizontal direction of the n type regions 9 and the p type regions 10 according to the carrier concentrations. And as mentioned above about the first embodiment, the parasitic capacitance can be reduced effectively by covering the trench gate with the depleted region. In order to reduce the parasitic capacitance effectively, as mentioned above about the first embodiment, it is desirable to provide so that the bottom of the trench gate may be located between the upper surface and the lower surface of the n type region 9 and the p type region 10.

However, if the carrier concentrations of the n type region 9 and the p type region 10 exceed $3 \times 10^{17}/cm^3$, the size along the horizontal direction of the n type regions 9 and the p type regions 10 must be set to 0.1 micrometers or less in order to make these regions depleted completely. It is often not easy in a practical manufacture process to form the n type regions 9 and the p type regions 10 of such detailed size by turns on the n type epitaxial region 6. Therefore, in this example, it is desirable to set the maximum of the carrier concentrations of the n type regions 9 and the p type regions 10 to about $3 \times 10^{17}/cm^3$.

On the other hand, since the n type region 9 connects the base region 5 and the epitaxial region 6 along the depth direction of the trench in this example, the path of channel current is also kept. As a result, the ON resistance (Ron) can be reduced.

Figure 21:
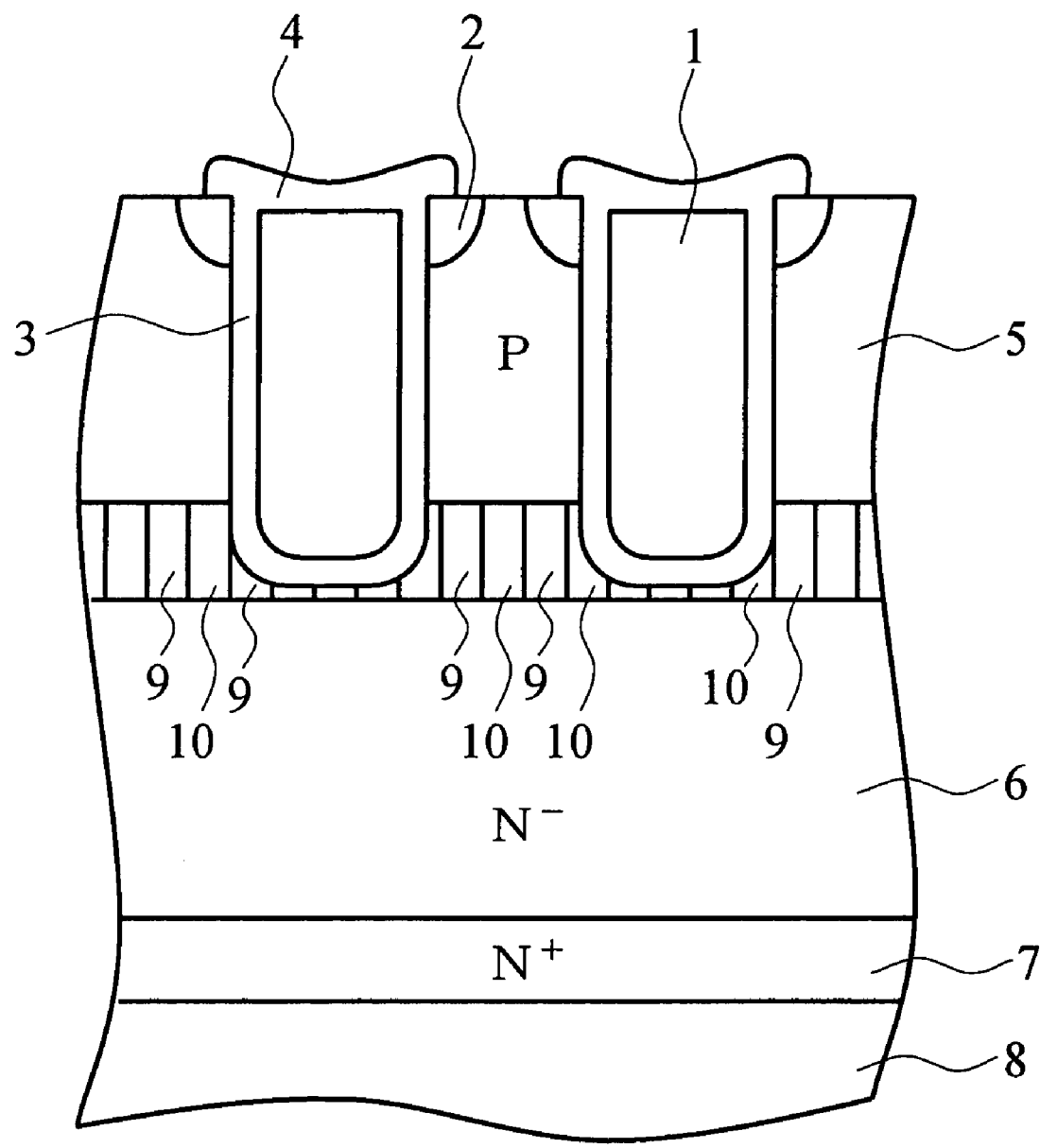
FIG. 21 is a schematic diagram illustrating the example in which the n type regions 9 and the p type regions 10 are made in a minute size.

Moreover, as shown in FIG. 21, it also becomes easy to scatter the paths of the channel current uniformly and keep a reliable current path by making the sizes of the n type regions 9 and the p type regions 10 small.

The planar arranging pattern of the n type regions 9 and the p type regions 10 in the invention is not limited to what are expressed in FIGS. 19 and 20. For example, the planar arranging pattern of the n type regions 9 and the p type regions 10 may also have the shape of polygon including the shape of a triangle and the shape of a hexagon, or may also be a pattern with which two or more p type regions 10 (or the n type regions 9) are scattered like the shape of dots in the plane of the n type region 9 (the p type region 10).

In addition, this embodiment can be applied to not only MOSFET but also to IGBT which is shown in FIG. 14, and the similar effect can be attained.

Figure 22:
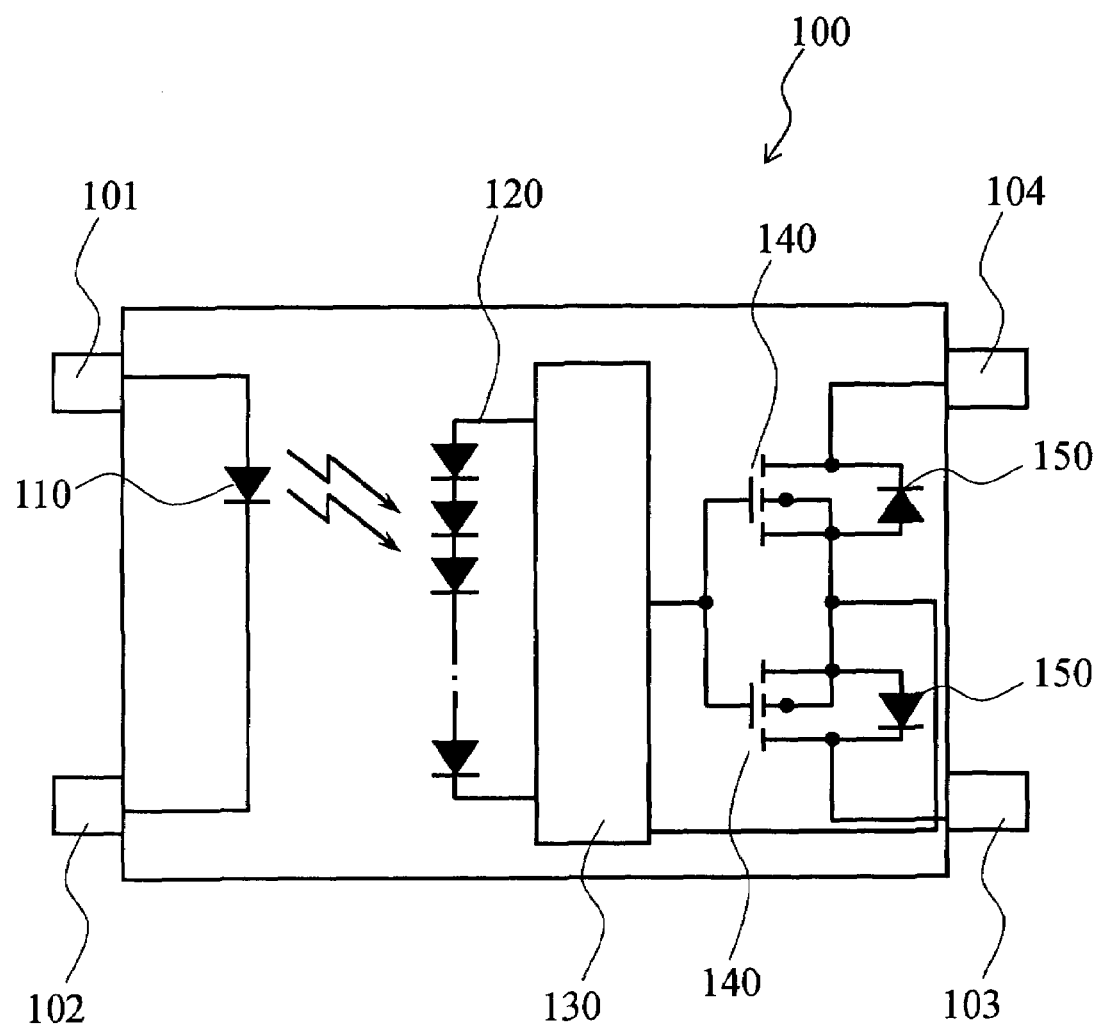
FIG. 22 is a conceptual diagram showing a photo-relay which comprises MOSFETs according to the invention.
Figure 23:
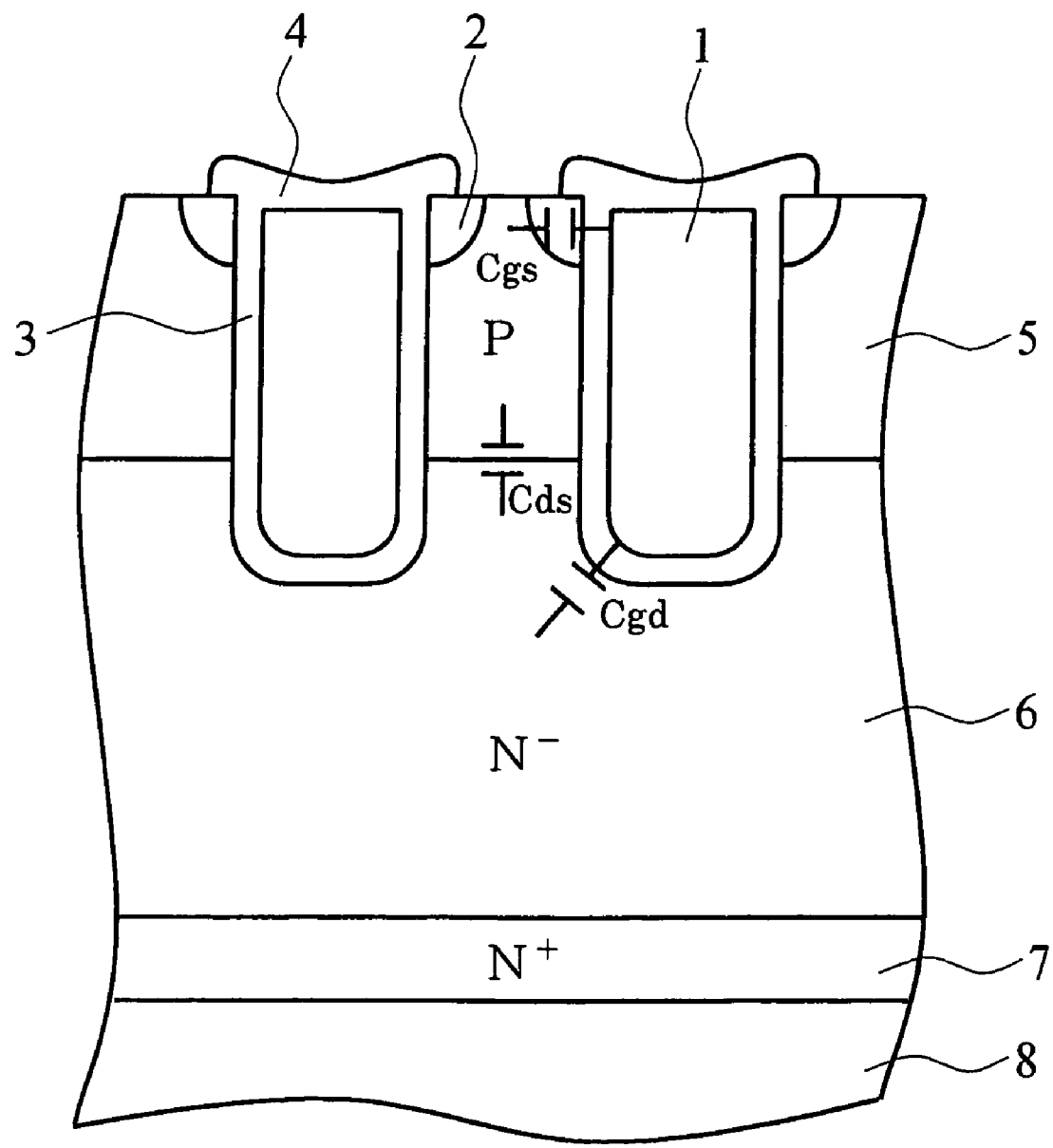
FIG. 23 is a schematic diagram showing the semiconductor device which was examined by the inventors of the present invention in the course of attaining this invention.

FIG. 22 is a conceptual diagram showing a photo-relay which comprises MOSFETs according to the invention. That is, the photo-relay 100 includes a pair of input terminals 101 and 102, and a pair of output terminals 103 and 104. The input terminals 101 and 102 are connected to a light emitting diode (LED) 110 in series.

Thus, by applying an appropriate input signal to the input terminals 101 and 102, the LED 110 will emit a light. The emitted light is received by the array of photodiodes 120, where the received light is converted into an electric signal. The signal is supplied to the control circuit 130. When the control circuit 130 receives the signal, the circuit 130 supplies a gate activating signal to the gates of the MOSFETs 140. Thus, the MOSFETs 140 is turned on, and the output terminals 103 and 104 are connected.

In the case of such a photo-relay, it is required that the MOSFETs 140 have a low resistance at the on-state while having a high impedance at the off-state. In order to satisfy such requisitions, it is important to reduce the output capacitance $C_{out}$ (=Cgd+Cds) and to reduce the on-resistance $R_{on}$ while keeping the breakdown voltage high.

According to the invention, it becomes possible to reduce the output capacitance $C_{out}$ and to reduce the on-resistance $R_{on}$ while keeping the breakdown voltage high. Thus, the photo-relay exemplarily shown in FIG. 22 is one of examples to which the invention can advantageously applied.

Heretofore, some embodiments of the present invention have been explained, referring to the examples. However, the present invention is not limited to these specific examples.

For example, in FIG. 1 through FIG. 21, the structure of the so-called "vertical type" where a main electrode is provided in the upper surface side of the element, and the main electrode of the other is provided in the back side of the element is illustrated. However, the present invention is not limited to this structure, but also can be applied to the semiconductor device of the structure of the so-called "lateral type" where any main electrodes are provided on the same side of the element and the similar effect can be attained.

In addition, about the structure of the semiconductor device of the present invention and the concrete composition, such as the materials, impurities, conduction types, thicknesses, sizes, and form of each element which constitutes the semiconductor device of the present invention, may be appropriately selected by those skilled in the art with the known techniques to carry out the invention as taught in the specification and obtain equivalent effects and all these transformations are included within the scope of the invention.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor device comprising:
   a first main electrode;
   a second main electrode;
   a semiconductor base region of a first conductivity type;
   a gate electrode provided in a trench through an insulating film, the trench being formed to penetrate the semiconductor base region; and
   a first semiconductor region of a second conductivity type provided under the semiconductor base region, a second semiconductor region of a first conductivity type provided under the first semiconductor region, a third semiconductor region of a second conductivity type provided under the second semiconductor region, and a fourth semiconductor region of a second conductivity type provided on the semiconductor base region,
   the first main electrode being provided on the fourth semiconductor region and the second main electrode being provided under the third semiconductor region,
   a flow of a current between the first and second main electrodes when a voltage of a predetermined direction is applied between these electrodes being controllable in accordance with a voltage applied to the gate electrode, and
   a depleted region extending from a junction between the first and the second semiconductor regions reaching the trench,
   wherein a bottom of the trench is provided within the second semiconductor region.

2. The semiconductor device according to claim 1, wherein a forward voltage is applied to a p-n junction formed between the first and second semiconductor regions when the voltage of the predetermined direction is applied between the first and second main electrodes.

3. The semiconductor device according to claim 1, wherein the second semiconductor region is in contact with the trench.

4. The semiconductor device according to claim 1, wherein a plurality of the first semiconductor regions and a plurality of the second semiconductor regions are laminated alternately under the semiconductor base region.

5. The semiconductor device according to claim 1, wherein the second semiconductor region is provided apart from the trench.

6. The semiconductor device according to claim 1, wherein a plurality of the first semiconductor region and the second semiconductor region are arranged alternately on a plane which is substantially perpendicular to a depth direction of the trench.

7. A semiconductor device comprising:
   a first semiconductor region of a second conductivity type;
   a second semiconductor region of a first conductivity type provided on the first semiconductor region,
   a third semiconductor region of a second conductivity type provided on the second semiconductor region,
   a fourth semiconductor region of a first conductivity type provided on the third semiconductor region,
   a fifth semiconductor region of a second conductivity type provided on the fourth semiconductor region,
   a trench penetrating at least the third through fifth semiconductor regions, a bottom of the trench being provided between an upper surface and a lower surface of the second semiconductor region;
   a sixth semiconductor region of a second conductivity type provided in contact with the bottom of the trench; and a gate electrode provided in the trench through an insulating film.

8. The semiconductor device according to claim 7, wherein the sixth semiconductor region is substantially depleted by a junction with the second semiconductor region.

9. The semiconductor device according to claim 7, wherein the second and the third semiconductor regions are substantially depleted.

10. The semiconductor device according to claim 7, wherein a carrier concentrations of the second and the third semiconductor regions are equal to or less than $3 \times 10^{16}/cm^3$.

11. A semiconductor device comprising:
- a first semiconductor region of a second conductivity type;
- a semiconductor layer provided on the first semiconductor region and having a plurality of second semiconductor regions of a first conductivity type and a plurality of third semiconductor regions of a second conductivity type, the second and the third semiconductor regions being arranged alternately;
- a fourth semiconductor region of a first conductivity type provided on the semiconductor layer,
- a fifth semiconductor region of a second conductivity type provided on the fourth semiconductor region,
- a trench penetrating at least the fourth and the fifth semiconductor regions, a bottom of the trench being provided within the semiconductor layer; and
- a gate electrode provided in the trench through an insulating film,
- wherein carrier concentrations of the second and the third semiconductor regions are equal to or less than $5 \times 10^{15}/cm^3$, and
- the trench is in contact with the second semiconductor region and the third semiconductor region.

12. The semiconductor device according to claim 1, wherein the second semiconductor region is in contact with a side of the trench, but is not in contact with a bottom of the trench, and a semiconductor region of a first conductivity type is provided instead.

13. A semiconductor device comprising:
- a first semiconductor region of a second conductivity type;
- a semiconductor layer provided on the first semiconductor region and having a plurality of second semiconductor regions of a first conductivity type and a plurality of third semiconductor regions of a second conductivity type, the second and the third semiconductor regions being arranged alternately along with two diagonal directions on the first semiconductor region;
- a fourth semiconductor region of a first conductivity type provided on the semiconductor layer,
- a fifth semiconductor region of a second conductivity type provided on the fourth semiconductor region,
- a trench penetrating at least the fourth and the fifth semiconductor regions, a bottom of the trench being provided within the semiconductor layer; and
- a gate electrode provided in the trench through an insulating film,
- the trench being in contact with the second semiconductor region and the third semiconductor region.

14. The semiconductor device according to claim 13, wherein the second and the third semiconductor regions are substantially depleted.

15. The semiconductor device according to claim 11, wherein a carrier concentrations of the second and the third semiconductor regions are equal to or less than $3 \times 10^{17}/cm^3$.

16. The semiconductor device according to claim 11, wherein a carrier concentrations of the second and the third semiconductor regions are equal to or less than $3 \times 10^{16}/cm^3$.

* * * * *